(12) United States Patent
Kondo

(10) Patent No.: US 10,374,002 B2
(45) Date of Patent: Aug. 6, 2019

(54) LAYERED STRUCTURE INCLUDING THYRISTOR AND LIGHT-EMITTING ELEMENT, LIGHT-EMITTING COMPONENT, LIGHT-EMITTING DEVICE, AND IMAGE FORMING APPARATUS

(71) Applicant: FUJI XEROX CO., LTD., Tokyo (JP)

(72) Inventor: Takashi Kondo, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/891,385

(22) Filed: Feb. 8, 2018

(65) Prior Publication Data

US 2018/0233534 A1    Aug. 16, 2018

(30) Foreign Application Priority Data

Feb. 13, 2017 (JP) ................... 2017-024433
Sep. 21, 2017 (JP) ................... 2017-181724
Sep. 21, 2017 (JP) ................... 2017-181727
Sep. 21, 2017 (JP) ................... 2017-181730

(51) Int. Cl.
*G03G 15/00* (2006.01)
*H01L 27/15* (2006.01)
(Continued)

(52) U.S. Cl.
CPC ....... *H01L 27/15* (2013.01); *G03G 15/04054* (2013.01); *G03G 15/04072* (2013.01); *H01L 21/02532* (2013.01); *H01L 21/02546* (2013.01); *H01L 21/30612* (2013.01); *H01L 29/125* (2013.01); *H01L 29/127* (2013.01); *H01L 29/2003* (2013.01); *H01L 29/267* (2013.01); *H01L 29/36* (2013.01); *H01L 29/66401* (2013.01); *H01L 29/744* (2013.01); *H01L 29/745* (2013.01); *H01L 29/7412* (2013.01); *H01L 31/1113* (2013.01);
(Continued)

(58) Field of Classification Search
CPC ....................................... H01L 27/15
USPC ............................................ 399/4
See application file for complete search history.

(56) References Cited

U.S. PATENT DOCUMENTS 7,948,004 B2    5/2011  Suzuki
2010/0038671 A1*  2/2010  Kondoh ............... B41J 2/45
                                                          257/99

(Continued)

FOREIGN PATENT DOCUMENTS

JP    H01238962      9/1989
JP    2001308385    11/2001
(Continued)

OTHER PUBLICATIONS

Computer translation of JP2013-168581A to Funkunaga (Fujimoto in action); published on Aug. 2013.*

*Primary Examiner* — Quana Grainger
(74) *Attorney, Agent, or Firm* — JCIPRNET

(57) ABSTRACT

A layered structure includes a thyristor and a light-emitting element. The thyristor at least includes four layers. The four layers are an anode layer, a first gate layer, a second gate layer, and a cathode layer arranged in this order. The light-emitting element is disposed such that the light-emitting element and the thyristor are connected in series. The thyristor includes a semiconductor layer having a bandgap energy smaller than bandgap energies of the four layers.

17 Claims, 19 Drawing Sheets

(51) Int. Cl.

| | | |
|---|---|---|
| H01L 33/00 | (2010.01) | |
| H01L 29/745 | (2006.01) | |
| H01S 5/062 | (2006.01) | |
| H01S 5/32 | (2006.01) | |
| G03G 15/04 | (2006.01) | |
| H01S 5/183 | (2006.01) | |
| H04N 1/028 | (2006.01) | |
| H04N 1/40 | (2006.01) | |
| H01L 21/02 | (2006.01) | |
| H01L 21/306 | (2006.01) | |
| H01L 29/12 | (2006.01) | |
| H01L 29/20 | (2006.01) | |
| H01L 29/267 | (2006.01) | |
| H01L 29/36 | (2006.01) | |
| H01L 29/66 | (2006.01) | |
| H01L 29/74 | (2006.01) | |
| H01L 29/744 | (2006.01) | |
| H01L 31/111 | (2006.01) | |
| H01L 33/06 | (2010.01) | |
| H01L 33/30 | (2010.01) | |
| H01L 33/32 | (2010.01) | |
| H01S 5/026 | (2006.01) | |
| H01S 5/042 | (2006.01) | |
| H01S 5/187 | (2006.01) | |
| H01S 5/343 | (2006.01) | |
| H05B 33/08 | (2006.01) | |
| H01S 5/20 | (2006.01) | |
| G03G 15/043 | (2006.01) | |
| G03G 15/18 | (2006.01) | |
| H01L 25/065 | (2006.01) | |
| H01L 29/45 | (2006.01) | |
| H01L 33/40 | (2010.01) | |
| H01L 33/44 | (2010.01) | |
| H01L 33/62 | (2010.01) | |

(52) U.S. Cl.
CPC ...... *H01L 33/0016* (2013.01); *H01L 33/0041* (2013.01); *H01L 33/0062* (2013.01); *H01L 33/0066* (2013.01); *H01L 33/06* (2013.01); *H01L 33/30* (2013.01); *H01L 33/32* (2013.01); *H01S 5/026* (2013.01); *H01S 5/0261* (2013.01); *H01S 5/042* (2013.01); *H01S 5/0425* (2013.01); *H01S 5/062* (2013.01); *H01S 5/187* (2013.01); *H01S 5/18361* (2013.01); *H01S 5/2022* (2013.01); *H01S 5/2027* (2013.01); *H01S 5/32* (2013.01); *H01S 5/34313* (2013.01); *H01S 5/34333* (2013.01); *H04N 1/02865* (2013.01); *H04N 1/40025* (2013.01); *H04N 1/40056* (2013.01); *H05B 33/0806* (2013.01); *G03G 15/043* (2013.01); *G03G 15/18* (2013.01); *G03G 2215/0404* (2013.01); *G03G 2215/0409* (2013.01); *H01L 21/0262* (2013.01); *H01L 21/02631* (2013.01); *H01L 25/0655* (2013.01); *H01L 29/452* (2013.01); *H01L 33/40* (2013.01); *H01L 33/44* (2013.01); *H01L 33/62* (2013.01); *H01L 2933/0025* (2013.01); *H01S 5/0421* (2013.01); *H01S 5/06203* (2013.01); *H01S 5/18313* (2013.01); *H01S 5/18369* (2013.01); *H01S 5/18377* (2013.01); *H01S 5/2059* (2013.01); *H01S 2304/02* (2013.01); *H01S 2304/04* (2013.01)

(56) References Cited

U.S. PATENT DOCUMENTS

| | | | |
|---|---|---|---|
| 2014/0111592 A1* | 4/2014 | van der Gucht | ............................ G03G 15/04054 347/118 |
| 2014/0320579 A1* | 10/2014 | Ohno | .................... H01L 33/005 347/141 |
| 2015/0097911 A1* | 4/2015 | Ono | ........................... B41J 2/45 347/130 |
| 2017/0277065 A1* | 9/2017 | Kondo | ............. G03G 15/04054 |

FOREIGN PATENT DOCUMENTS

| | | | | |
|---|---|---|---|---|
| JP | 2005116858 | A | * | 4/2005 |
| JP | 2009286048 | | | 12/2009 |
| JP | 2013065591 | A | * | 4/2013 |
| JP | 2013065591 | A | * | 4/2013 |
| JP | 2013168581 | A | * | 8/2013 |
| JP | 2016039338 | A | * | 3/2016 |

* cited by examiner

US 10,374,002 B2

LAYERED STRUCTURE INCLUDING THYRISTOR AND LIGHT-EMITTING ELEMENT, LIGHT-EMITTING COMPONENT, LIGHT-EMITTING DEVICE, AND IMAGE FORMING APPARATUS

CROSS-REFERENCE TO RELATED APPLICATIONS

This application is based on and claims priority under 35 USC 119 from Japanese Patent Application No. 2017-024433 filed Feb. 13, 2017, No. 2017-181724 filed Sep. 21, 2017, No. 2017-181727 filed Sep. 21, 2017, and No. 2017-181730 filed Sep. 21, 2017.

BACKGROUND

Technical Field

The present invention relates to a layered structure, a light-emitting component, a light-emitting device, and an image forming apparatus.

SUMMARY

According to an aspect of the invention, there is provided a layered structure including a thyristor and a light-emitting element. The thyristor at least includes four layers. The four layers are an anode layer, a first gate layer, a second gate layer, and a cathode layer arranged in this order. The light-emitting element is disposed such that the light-emitting element and the thyristor are connected in series. The thyristor includes a semiconductor layer having a bandgap energy smaller than bandgap energies of the four layers.

BRIEF DESCRIPTION OF THE DRAWINGS

Exemplary embodiments of the present invention will be described in detail based on the following figures, wherein:

FIG. 6A is a plan layout view of the light-emitting chip and FIG. 6B is a cross-sectional view taken along line VIB-VIB illustrated in FIG. 6A;

FIG. 8A is a cross-sectional view of a thyristor according to the first exemplary embodiment including a voltage reduction layer, FIG. 8B is a cross-sectional view of a thyristor not including a voltage reduction layer, and FIG. 8C illustrates characteristics of the thyristors;

FIG. 10A is a schematic energy band diagram of the layered structure of the driving thyristor and the light-emitting diode, FIG. 10B is an energy band diagram at a tunnel junction layer in a reverse-biased state, and FIG. 10C illustrates current-voltage characteristics of the tunnel junction layer;

FIG. 12A illustrates a step of forming a semiconductor stack, FIG. 12B illustrates a step of forming an n-ohmic electrode and a light exit protection layer, FIG. 12C illustrates an etching step for exposing the tunnel junction layer, FIG. 12D illustrates a step of forming a current blocking portion in a current constriction layer, FIG. 12E illustrates an etching step for exposing a p-gate layer, and FIG. 12F illustrates a step of forming a p-ohmic electrode and a back-surface electrode;

FIG. 13A illustrates the case where the voltage reduction layer is disposed between a p-gate layer and an n-cathode layer of the driving thyristor, FIG. 13B illustrates the case where the voltage reduction layer is disposed between an n-gate layer and a p-gate layer of the driving thyristor, FIG. 13C illustrates the case where the n-gate layer serves as the voltage reduction layer, and FIG. 13D illustrates the case where the p-gate layer serves as the voltage reduction layer;

DETAILED DESCRIPTION

Exemplary embodiments of the present invention will be described in detail below with reference to the accompanying drawings.

Note that a chemical symbol is used to represent a substance below in such a manner that Al is used for aluminum.

First Exemplary Embodiment

Image Forming Apparatus 1

Figure 1:
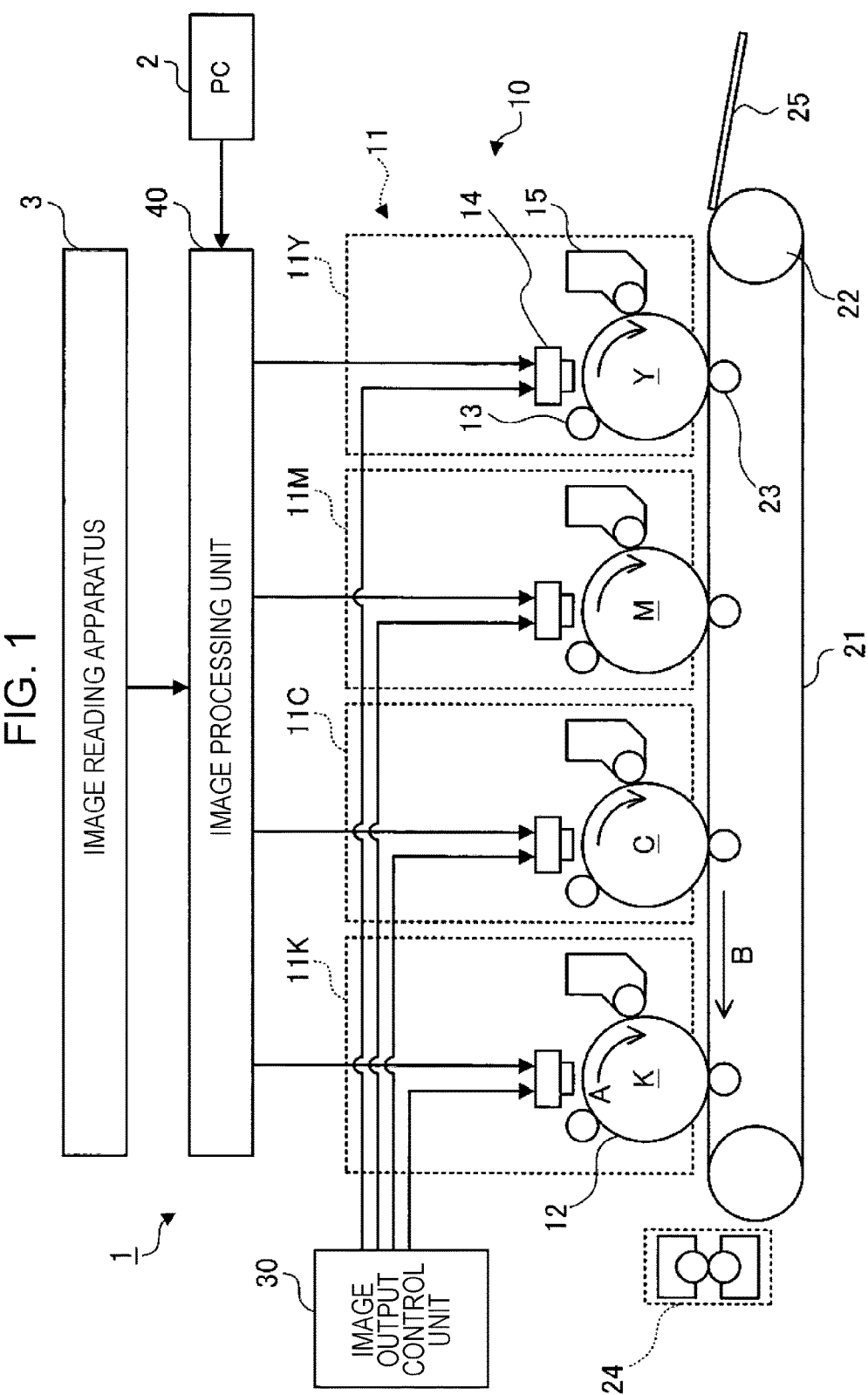
FIG. 1 illustrates an example of an overall configuration of an image forming apparatus to which a first exemplary embodiment is applied.

FIG. 1 illustrates an example of an overall configuration of an image forming apparatus 1 to which a first exemplary embodiment is applied. The image forming apparatus 1 illustrated in FIG. 1 is an image forming apparatus generally called a tandem type. The image forming apparatus 1 includes an image forming process unit 10, an image output control unit 30, and an image processing unit 40. The image forming process unit 10 forms an image in accordance with image data of each color. The image output control unit 30 controls the image forming process unit 10. The image processing unit 40 is connected to, for example, a personal computer (PC) 2 and an image reading apparatus 3 and performs predetermined image processing on image data received from the PC 2 and the image reading apparatus 3.

The image forming process unit 10 includes image forming units 11Y, 11M, 11C, and 11K that are disposed in parallel to each other with a predetermined space therebetween. The image forming units 11Y, 11M, 11C, and 11K are referred to as image forming units 11 when they are not distinguished from one another. Each of the image forming units 11 includes a photoconductor drum 12, a charger 13, a printhead 14, and a developer 15. The photoconductor drum 12, which is an example of an image bearing member, bears an electrostatic latent image and a toner image formed thereon. The charger 13, which is an example of a charging member, charges the surface of the photoconductor drum 12 to a predetermined potential. The printhead 14 exposes the photoconductor drum 12 that has been charged by the charger 13 to light. The developer 15, which is an example of a developing member, develops the electrostatic latent image obtained by the printhead 14. The image forming units 11Y, 11M, 11C, and 11K form toner images of yellow (Y), magenta (M), cyan (C), and black (K), respectively.

The image forming process unit 10 also includes a sheet transporting belt 21, a drive roll 22, transfer rolls 23, and a fixer 24 to transfer the toner images of the respective colors formed on the photoconductor drums 12 of the respective image forming units 11Y, 11M, 11C, and 11K onto a recording sheet 25 so that the toner images are superimposed together. The recording sheet 25 is an example of a transferred-image-receiving medium. The sheet transporting belt 21 transports the recording sheet 25. The drive roll 22 drives the sheet transporting belt 21. Each of the transfer rolls 23, which is an example of a transfer member, transfers the corresponding toner image on the corresponding photoconductor drum 12 onto the recording sheet 25. The fixer 24 fixes the toner images on the recording sheet 25.

In the image forming apparatus 1, the image forming process unit 10 performs an image forming operation in accordance with various control signals supplied thereto from the image output control unit 30. Under control of the image output control unit 30, the image processing unit 40 performs image processing on image data received from the PC 2 or the image reading apparatus 3 and supplies the resultant image data to the image forming units 11. Then, for example, in the image forming unit 11K for black (K), the photoconductor drum 12 is charged to a predetermined potential by the charger 13 while rotating in a direction of an arrow A and is exposed to light by the printhead 14 that emits light on the basis of the image data supplied thereto from the image processing unit 40. Consequently, an electrostatic latent image for an image of black (K) is formed on the photoconductor drum 12. The electrostatic latent image formed on the photoconductor drum 12 is then developed by the developer 15, and consequently a toner image of black (K) is formed on the photoconductor drum 12. Toner images of yellow (Y), magenta (M), and cyan (C) are formed in the image forming units 11Y, 11M, and 11C, respectively.

The toner images of the respective colors formed on the respective photoconductor drums 12 in the corresponding image forming units 11 are sequentially transferred electrostatically onto the recording sheet 25 that is fed in response to a movement of the sheet transporting belt 21 moving in a direction of an arrow B, by a transfer electric field applied to the transfer rolls 23. Consequently, a combined toner image in which the toner images of the respective colors are superimposed together is formed on the recording sheet 25.

Then, the recording sheet 25 having the electrostatically transferred combined toner image is transported to the fixer 24. The combined toner image on the recording sheet 25 transported to the fixer 24 undergoes a heat/pressure-based fixing process performed by the fixer 24 and is fixed on the recording sheet 25. Then, the recording sheet 25 is discharged from the image forming apparatus 1.

Printhead 14

Figure 2:
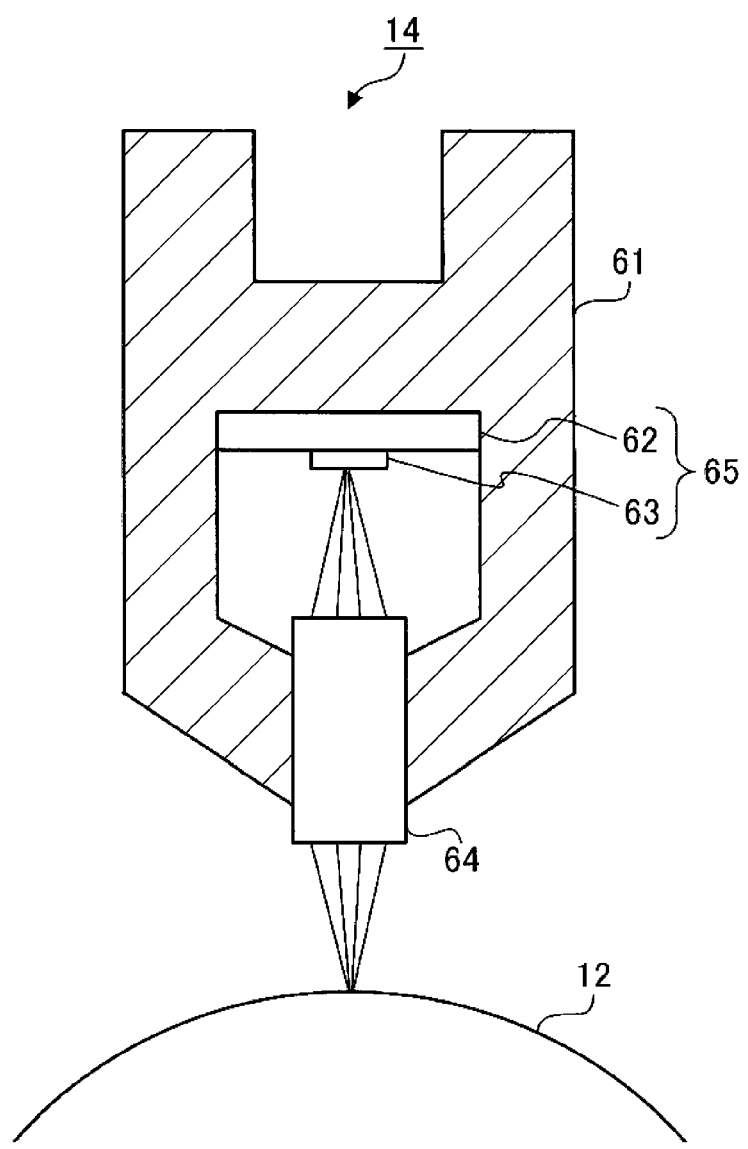
FIG. 2 is a cross-sectional view illustrating an example of a configuration of a printhead.

FIG. 2 is a cross-sectional view illustrating an example of a configuration of the printhead 14. The printhead 14, which is an example of an exposure device, includes a housing 61, a light-emitting device 65, and a rod lens array 64. The light-emitting device 65, which is an example of a light-emitting device, includes a light source unit 63 including plural light-emitting elements that expose the photoconductor drum 12 to light. In the first exemplary embodiment, the light-emitting elements are light-emitting diodes (LEDs), each of which is an example of a light-emitting element. The rod lens array 64, which is an example of an optical system, focuses the light emitted from the light source unit 63 onto the surface of the photoconductor drum 12 to form an image thereon.

The light-emitting device 65 includes a circuit board 62 on which the light source unit 63 described above, a signal generation circuit 110 (described later with reference to FIG. 3) that drives the light source unit 63, and so forth are mounted.

The housing 61 is formed of a metal, for example. The housing 61 supports the circuit board 62 and the rod lens array 64 to set the light-emitting surface of the light-emitting elements of the light source unit 63 to be a focal plane of the rod lens array 64. In addition, the rod lens array 64 is disposed in an axial direction of the photoconductor drum 12 (which is a main scanning direction and an X direction in FIGS. 3 and 4B described later).

Light-Emitting Device 65

Figure 3:
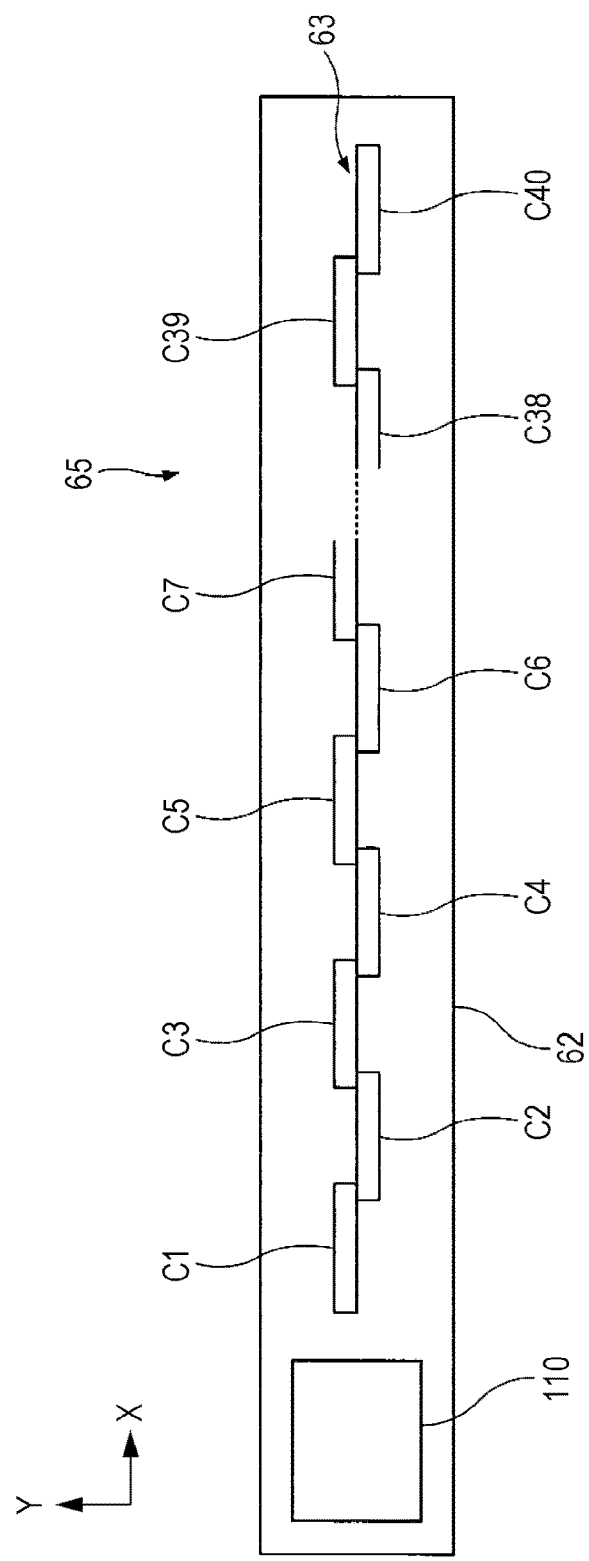
FIG. 3 is a top view of an example of a light-emitting device.

FIG. 3 is a top view of an example of the light-emitting device 65.

In the light-emitting device 65 illustrated by way of example in FIG. 3, the light source unit 63 includes 40 light-emitting chips C1 to C40 arranged in two lines in the X direction which is the main scanning direction on the circuit board 62 to form a staggered pattern. The light-emitting chips C1 to C40, each of which is an example of a light-emitting component, are referred to as light-emitting chips C when they are not distinguished from one another. The light-emitting chips C1 to C40 may have an identical configuration.

Herein, a symbol "-" or a word "to" is used to indicate plural components that are distinguished from one another using numbers and indicates that the plural components include components that are assigned the numbers preceding and following the symbol "-" or the word "to" and components that are assigned numbers between the preceding and following numbers. For example, the light-emitting chips C1-C40 (C1 to C40) include the light-emitting chip C1 through the light-emitting chip C40 in the numbered order.

In the first exemplary embodiment, 40 light-emitting chips C in total are used; however, the number of light-emitting chips C is not limited to 40.

The light-emitting device 65 includes the signal generation circuit 110 that drives the light source unit 63. The signal generation circuit 110 is constituted by an integrated circuit (IC), for example. Note that the light-emitting device 65 need not necessarily include the signal generation circuit 110. In such a case, the signal generation circuit 110 is provided outside the light-emitting device 65 and supplies control signals for controlling the light-emitting chips C or the like to the light-emitting device 65 through a cable or the like. The description is given herein on the assumption that the light-emitting device 65 includes the signal generation circuit 110.

An arrangement of the light-emitting chips C will be described in detail later.

FIGS. 4A and 4B illustrate an example of a configuration of each of the light-emitting chips C, an example of a configuration of the signal generation circuit 110 of the light-emitting device 65, and an example of a configuration of wires (lines) on the circuit board 62. Specifically, FIG. 4A illustrates the configuration of the light-emitting chip C, and FIG. 4B illustrates the configuration of the signal generation circuit 110 of the light-emitting device 65 and the configuration of wires (lines) on the circuit board 62. Note that FIG. 4B illustrates the light-emitting chips C1 to C9 among the light-emitting chips C1 to C40.

First, the configuration of the light-emitting chip C illustrated in FIG. 4A will be described.

The light-emitting chip C includes a light-emitting unit 102 including plural light-emitting elements arranged in a line along long sides to be closer to one of the long sides on a front surface of a substrate 80 that has a rectangular shape. In the first exemplary embodiment, the plural light-emitting elements are light-emitting diodes LED1 to LED128. The light-emitting diodes LED1 to LED128 are referred to as light-emitting diodes LED when they are not distinguished from one another. The light-emitting chip C further includes terminals ($\phi$1, $\phi$2, Vga, and $\phi$I) at respective ends of a long-side direction on the front surface of the substrate 80. The terminals are plural bonding pads for receiving various control signals, for example. These terminals are disposed in an order of the terminal $\phi$I and the terminal $\phi$1 from one of the ends of the substrate 80 and in an order of the terminal Vga and the terminal $\phi$2 from the other end of the substrate 80. The light-emitting unit 102 is disposed between the terminals $\phi$1 and $\phi$2. A back-surface electrode 92 (see FIGS. 6A and 6B described later), which serves as a terminal Vsub, is also disposed on a back surface of the substrate 80. A direction in which the light-emitting elements (i.e., the light-emitting diodes LED1-LED128) are arranged on the front surface of the substrate 80 is defined as an x direction, and a direction perpendicular to the x direction is defined as a y direction.

Note that the expression "arranged in a line" refers not only to a state in which plural light-emitting elements are arranged in a line as illustrated in FIG. 4A but also to a state in which the plural light-emitting elements are shifted from each other by different displacement amounts in a direction perpendicular to the direction of the line. For example, the light-emitting elements may be arranged to be shifted from each other by a displacement amount in a direction perpendicular to the direction of the line. In addition, sets of adjacent light-emitting elements or of plural light-emitting elements may be arranged in a zigzag pattern.

The configuration of the signal generation circuit 110 of the light-emitting device 65 and the configuration of wires (lines) on the circuit boards 62 will be described next with reference to FIG. 4B.

As described above, the signal generation circuit 110 and the light-emitting chips C1 to C40 are mounted on the circuit board 62 of the light-emitting device 65, and wires (lines) that connect the signal generation circuit 110 and the respective light-emitting chips C1 to C40 to each other are provided on the circuit board 62.

The configuration of the signal generation circuit 110 will be described first.

The signal generation circuit 110 receives various control signals and pieces of image data that have been subjected to image processing respectively from the image output control unit 30 and the image processing unit 40 (see FIG. 1). The signal generation circuit 110 rearranges the pieces of image data and corrects an amount of light on the basis of the pieces of image data and the various control signals.

The signal generation circuit 110 includes a transfer signal generation unit 120 that sends a first transfer signal $\phi$1 and a second transfer signal $\phi$2 to the light-emitting chips C1 to C40 on the basis of the various control signals.

The signal generation circuit 110 also includes a turn-on signal generation unit 140 that sends turn-on signals $\phi$I1 to $\phi$I40 to the light-emitting chips C1 to C40 on the basis of the various control signals, respectively. The turn-on signals $\phi$I1 to $\phi$I40 are referred to as turn-on signals $\phi$I when they are not distinguished from each other.

The signal generation circuit 110 further includes a reference potential supplying unit 160 and a power supply potential supplying unit 170. The reference potential supplying unit 160 supplies a reference positional Vsub, which serves as a reference of the potential, to the light-emitting chips C1 to C40. The power supply potential supplying unit 170 supplies a power supply potential Vga for driving the light-emitting chips C1 to C40.

The arrangement of the light-emitting chips C1 to C40 will be described next.

Odd-numbered light-emitting chips C1, C3, C5, . . . are arranged in a line in a long-side direction of the substrate 80 with a space interposed therebetween. Even-numbered light-emitting chips C2, C4, C6, . . . are also arranged in a line in the long-side direction of the substrate 80 with a space interposed therebetween. The odd-numbered light-emitting chips C1, C3, C5, . . . and the even-numbered light-emitting chips C2, C4, C6, . . . are arranged in a staggered pattern with being rotated by 180° from each other so that the long sides close to the light-emitting units 102 on the adjacent odd-numbered and even-numbered light-emitting chips C face each other. Positions of the light-emitting chips C are set such that the light-emitting diodes LED of the light-emitting chips C are arranged in the main scanning direction (X direction) at predetermined intervals. Note that a direction in which the light-emitting elements of the light-emitting unit 102 illustrated in FIG. 4A are arranged (i.e., the numbered order of the light-emitting diodes LED1 to LED 128 in the first exemplary embodiment) is indicated using an arrow in each of the light-emitting chips C1 to C40 in FIG. 4B.

The wires (lines) that connect the signal generation circuit 110 and the light-emitting chips C1 to C40 to each other will be described.

A power supply line 200a is provided on the circuit board 62. The power supply line 200a is connected to the back-surface electrodes 92 (see FIGS. 6A and 6B described later) which serve as the terminals Vsub disposed on the back surfaces of the substrates 80 of the respective light-emitting chips C and supplies the reference potential Vsub.

A power supply line 200b is also provided on the circuit board 62. The power supply line 200b supplies the power supply potential Vga for driving. The power supply line 200b connects the power supply potential supplying unit 170 of the signal generation circuit 110 and the terminals Vga provided in the respective light-emitting chips C to each other.

A first transfer signal line 201 and a second transfer signal line 202 are provided on the circuit board 62. The first transfer signal line 201 is used to send the first transfer signal $\phi 1$ from the transfer signal generation unit 120 of the signal generation circuit 110 to the terminals $\phi 1$ of the respective light-emitting chips C1 to C40. The second transfer signal line 202 is used to send the second transfer signal $\phi 2$ from the transfer signal generation unit 120 of the signal generation circuit 110 to the terminals $\phi 2$ of the respective light-emitting chips C1 to C40. The first transfer signal $\phi 1$ and the second transfer signal $\phi 2$ are sent to the light-emitting chips C1 to C40 in common (in parallel).

In addition, turn-on signal lines 204-1 to 204-40 are provided on the circuit board 62. The turn-on signal lines 204-1 to 204-40 are used to send the turn-on signals $\phi I1$ to $\phi I40$ from the turn-on signal generation unit 140 of the signal generation circuit 110 to the terminals $\phi I$ of the light-emitting chips C1 to C40 through respective current-limiting resistors RI, respectively. The turn-on signal lines 204-1 to 204-40 are referred to as turn-on signal lines 204 when they are not distinguished from one another.

As described above, the reference potential Vsub and the power supply potential Vga are supplied to all the light-emitting chips C1 to C40 on the circuit board 62 in common. The first transfer signal $\phi 1$ and the second transfer signal $\phi 2$ are also sent to the light-emitting chips C1 to C40 in common (in parallel). On the other hand, the turn-on signals $\phi I1$ to $\phi I40$ are individually sent to the light-emitting chips C1 to C40, respectively.

Light-Emitting Chip C

Figure 4:
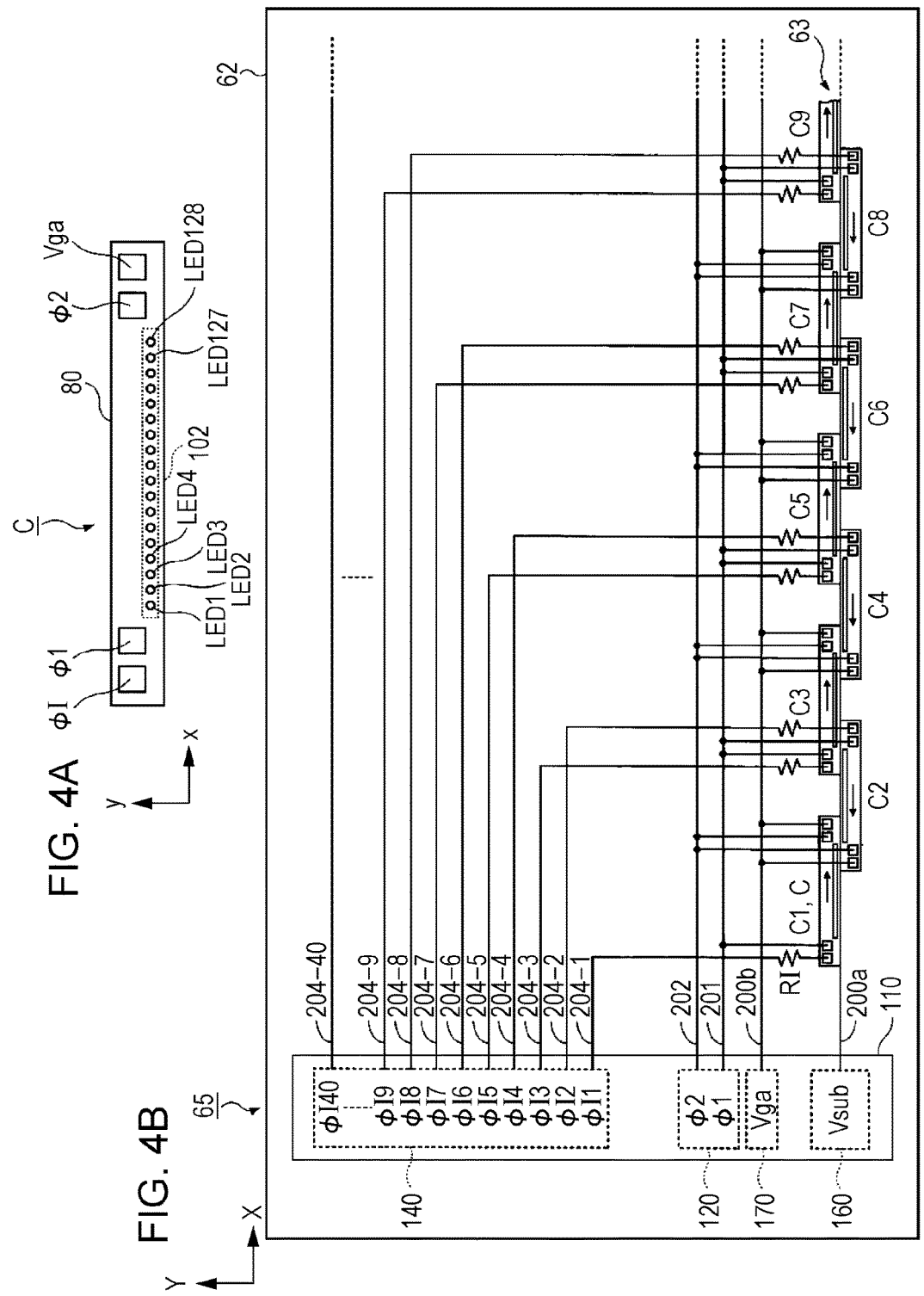
FIGS. 4A and 4B illustrate an example of a configuration of a light-emitting chip, an example of a configuration of a signal generation circuit of the light-emitting device, and an example of a configuration of wires (lines) on a circuit board.
Figure 5:
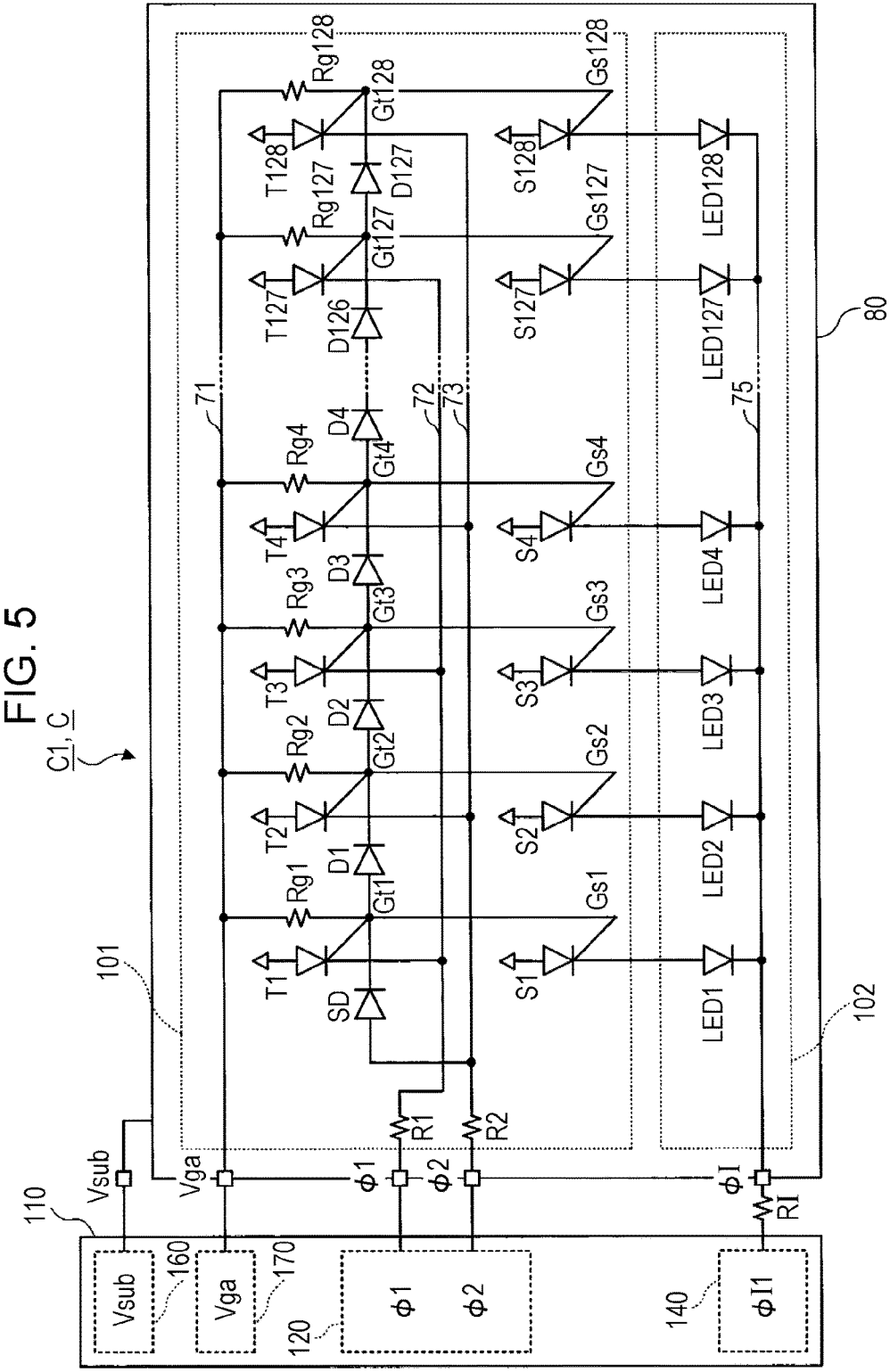
FIG. 5 is an equivalent circuit diagram illustrating a circuit configuration of the light-emitting chip in which a self-scanning light-emitting device (SLED) array according to the first exemplary embodiment is mounted.

FIG. 5 is an equivalent circuit diagram illustrating a circuit configuration of the light-emitting chip C in which an SLED array according to the first exemplary embodiment is mounted. Elements described below are arranged in accordance with the layout (see FIGS. 6A and 6B described later) on the light-emitting chip C except for the terminals ($\phi 1$, $\phi 2$, Vga, and $\phi I$). Note that the positions of the terminals ($\phi 1$, $\phi 2$, Vga, and $\phi I$) are different from those illustrated in FIG. 4A because the terminals are illustrated on the left end in FIG. 5 in order to describe connections with the signal generation circuit 110. The terminal Vsub provided on the back surface of the substrate 80 is illustrated outside the substrate 80 as an extended terminal.

The light-emitting chips C will be described in relationship with the signal generation circuit 110 by using the light-emitting chip C1 by way of example. Accordingly, the light-emitting chip C is referred to as the light-emitting chip C1(C) in FIG. 5. The other light-emitting chips C2 to C40 have the same or substantially the same configuration as the light-emitting chip C1.

The light-emitting chip C1(C) includes the light-emitting unit 102 (see FIG. 4A) including the light-emitting diodes LED1 to LED128.

The light-emitting chip C1(C) also includes driving thyristors S1 to S128, which are referred to driving thyristors S when they are not distinguished from one another. The light-emitting diodes LED1 to LED128 are connected to the driving thyristors S1 to S128, respectively, such that the light-emitting diode LED and the driving thyristor that are assigned the same number are connected in series.

Figure 6B:
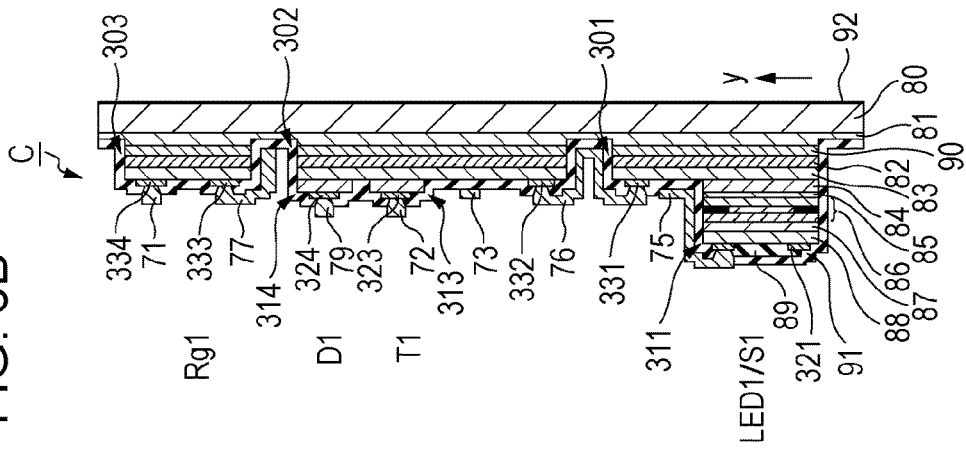
FIGS. 6A and 6B are examples of a plan layout view and a cross-sectional view of the light-emitting chip according to the first exemplary embodiment, specifically.

As illustrated in FIG. 6B described later, the light-emitting diodes LEDs that are arranged in a line on the substrate 80 are stacked on the respective driving thyristors S. Thus, the driving thyristors S1 to S128 are also arranged in a line. Since the driving thyristors S set (control) on/off of the respective light-emitting diodes LED as described later, the driving thyristors S are elements that drive the respective light-emitting diodes LED. Note that the driving thyristors S are sometimes simply referred to as thyristors.

The light-emitting chip C1(C) further includes transfer thyristors T1 to T128 that are also arranged in a line just like the light-emitting diodes LED1 to LED128 and the driving thyristors S1 to S128. The transfer thyristors T1 to T128 are referred to as transfer thyristors T when they are not distinguished from one another.

Although the description is given here by using the transfer thyristors T as an example of transfer elements, the transfer elements may be any other circuit elements that sequentially turn on. For example, a shift register or a circuit element including a combination of plural transistors may be alternatively used.

In addition, the light-emitting chip C1(C) includes coupling diodes D1 to D127 disposed between respective pairs of the transfer thyristors T1 to T128 in the numbered order. The coupling diodes D1 to D127 are referred to as coupling diodes D when they are not distinguished from one another.

Furthermore, the light-emitting chip C1(C) includes power supply line resistors Rg1 to Rg128, which are referred to as power supply line resistors Rg when they are not distinguished from one another.

The light-emitting chip C1(C) also includes a start diode SD. In addition, the light-emitting chip C1(C) includes current-limiting resistors R1 and R2 that are provided to prevent an excessive current from flowing through a first transfer signal line 72 (described later) used to send the first transfer signal $\phi 1$ and through a second transfer signal line 73 (described later) used to send the second transfer signal $\phi 2$.

In this example, the driving thyristors S1 to S128, the transfer thyristors T1 to T128, the power supply line resistors Rg1 to Rg128, the coupling diodes D1 to D127, the start diode SD, and the current-limiting resistors R1 and R2 constitute a transfer unit 101.

The light-emitting diodes LED1 to LED128 of the light-emitting unit 102 and the driving thyristors S1 to S128 and the transfer thyristors T1 to T128 of the transfer unit 101 are arranged in the numbered order from the left in FIG. 5. Further, the coupling diodes D1 to D127 and the power supply line resistors Rg1 to Rg128 are also arranged in the numbered order from the left in FIG. 5.

The transfer unit 101 and the light-emitting unit 102 are arranged in this order from the top in FIG. 5.

In the first exemplary embodiment, the number of light-emitting diodes LED of the light-emitting unit 102 and the number of driving thyristors S, the number of transfer thyristors T, and the number of power supply line resistors Rg of the transfer unit 101 are set equal to 128. The number of coupling diodes D is equal to 127, which is less than the number of transfer thyristors T by 1.

The numbers of light-emitting diodes LED and other elements are not limited to the above numbers and may be set equal to predetermined numbers. The number of transfer thyristors T may be greater than the number of light-emitting diodes LED.

Each of the light-emitting diodes LED is a two-terminal semiconductor element having an anode terminal (anode) and a cathode terminal (cathode). Each of the thyristors (the driving thyristors S and the transfer thyristors T) is a three-terminal semiconductor element having an anode terminal (anode), a gate terminal (gate), and a cathode terminal (cathode). Each of the coupling diode D and the start diode SD is a two-terminal semiconductor element having an anode terminal (anode) and a cathode terminal (cathode).

Note that the light-emitting diodes LED, the thyristors (the driving thyristors S and the transfer thyristors T), the coupling diode D, and the start diode SD do not necessarily have the anode terminal, the gate terminal, or the cathode terminal that is formed as an electrode in some cases. Thus, hereinafter, the anode terminal, the gate terminal, and the cathode terminal are sometimes referred to as an anode, a gate, or a cathode, respectively.

Electrical connections between the elements of the light-emitting chip C1(C) will be described next.

The anodes of the transfer thyristors T and the driving thyristors S are connected to the substrate 80 of the light-emitting chip C1(C) (anode-common).

These anodes are connected to the power supply line 200a (see FIG. 4A) through the back-surface electrode 92 (see FIG. 6B described later) which is the terminal Vsub provided on the back surface of the substrate 80. This power supply line 200a is supplied with the reference potential Vsub from the reference potential supplying unit 160.

Note that this connection is a configuration implemented when a p-type substrate is used as the substrate 80. When an n-type substrate is used, the polarity is reversed. When an intrinsic (i-type) (semi-insulating or insulating) substrate that is not doped with any impurities is used, a terminal connected to the power supply line 200a that supplies the reference potential Vsub is provided on the side of the substrate on which the transfer unit 101 and the light-emitting unit 102 are disposed.

The cathodes of the odd-numbered transfer thyristors T1, T3, . . . are connected to the first transfer signal line 72 along the line of the transfer thyristors T. The first transfer signal line 72 is connected to the terminal φ1 through the current-limiting resistor R1. The first transfer signal line 201 (see FIG. 4B) is connected to the terminal φ1, and the first transfer signal φ1 is sent to the terminal φ1 from the transfer signal generation unit 120.

On the other hand, the cathodes of the even-numbered transfer thyristors T2, T4, . . . are connected to the second transfer signal line 73 along the line of the transfer thyristors T. The second transfer signal line 73 is connected to the terminal φ2 through the current-limiting resistor R2. The second transfer signal line 202 (see FIG. 4B) is connected to the terminal φ2, and the second transfer signal φ2 is sent to the terminal φ2 from the transfer signal generation unit 120.

The cathodes of the light-emitting diodes LED1 to LED128 are connected to a turn-on signal line 75. The turn-on signal line 75 is connected to the terminal φI. The terminal φI of the light-emitting chip C1 is connected to the turn-on signal line 204-1 through the current-limiting resistor RI that is provided outside the light-emitting chip C1(C), and the turn-on signal φI1 is sent to the terminal φI from the turn-on signal generation unit 140 (see FIG. 4B). The turn-on signal φI1 supplies a current for turning on the light-emitting diodes LED1 to LED128. Note that the turn-on signal lines 204-2 to 204-40 are respectively connected to the terminals φI of the other light-emitting chips C2 to C40 through the respective current-limiting resistors RI, and the turn-on signals φI2 to φI40 are sent to the respective terminals φI from the turn-on signal generation unit 140 (see FIG. 4B).

Gates Gt1 to Gt128 of the transfer thyristors T1 to T128 are connected to gates Gs1 to Gs128 of the driving thyristors S1 to S128, respectively, to have a one-to-one correspondence. The gates Gt1 to Gt128 are referred to as gates Gt when they are not distinguished from one another, and the gates Gs1 to Gs128 are referred to as gates Gs when they are not distinguished from one another. Thus, each pair of gates assigned the same number among the gates Gt1 to Gt128 and the gates Gs1 to Gs128 has an electrically equal potential. For example, the expression "gate Gt1 (gate Gs1)" indicates that the gate Gt1 and the gate Gs1 have an equal potential.

Each of the coupling diodes D1 to D127 is connected between a corresponding pair of gates Gt, which are two of the gates Gt1 to Gt128 of the transfer thyristors T1 to T128 in the numbered order. That is, the coupling diodes D1 to D127 are connected in series so that each of the coupling diodes D1 to D127 is interposed between a corresponding pair among the gates Gt1 to Gt128. The coupling diode D1 is connected so that current flows from the gate Gt1 to the gate Gt2. The same applies to the other coupling diodes D2 to D127.

The gates Gt (gates Gs) of the transfer thyristors T are connected to a power supply line 71 through the respective power supply line registers Rg provided for the corresponding transfer thyristors T. The power supply line 71 is connected to the terminal Vga. The power supply line 200b (see FIG. 4B) is connected to the terminal Vga, and the terminal Vga is supplied with the power supply potential Vga from the power supply potential supplying unit 170.

The gate Gt1 of the transfer thyristor T1 is connected to the cathode terminal of the start diode SD. The anode of the start diode SD is connected to the second transfer signal line 73.

Figure 6A:
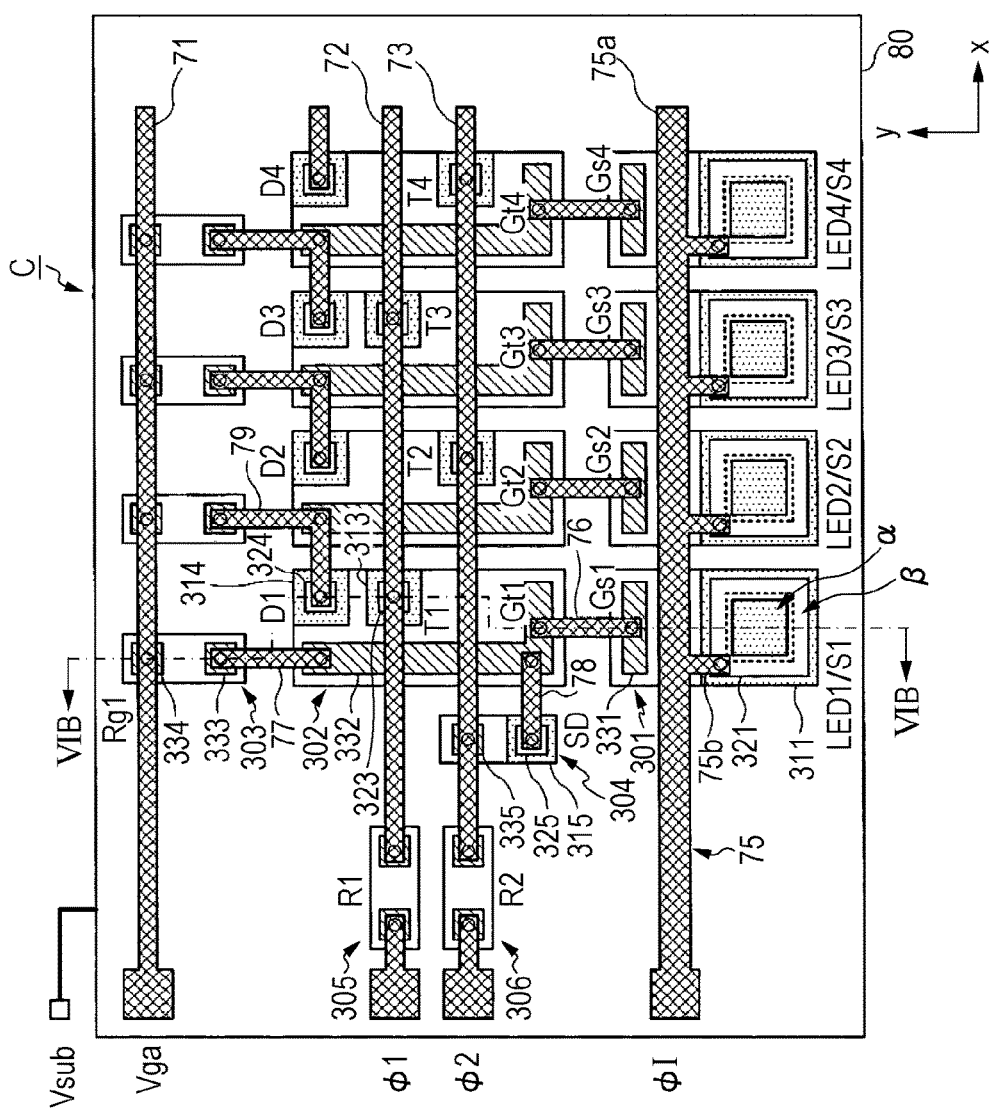

FIGS. 6A and 6B are an example of a plan layout view and a cross-sectional view of the light-emitting chip C according to the first exemplary embodiment. Specifically, FIG. 6A is a plan layout view of the light-emitting chip C, and FIG. 6B is a cross-sectional view taken along line VIB-VIB illustrated in FIG. 6A. Since connections between the light-emitting chips C and the signal generation circuit 110 are not illustrated in FIGS. 6A and 6B, it is not necessarily to use the light-emitting chip C1 by way of example. Thus, the term "light-emitting chip C" is used.

FIG. 6A mainly illustrates a portion around the light-emitting diodes LED1 to LED4, the driving thyristors S1 to S4, and the transfer thyristors T1 to T4. Note that the terminals (φ1, φ2, Vga, and φI) are illustrated at the left end portion in FIG. 6A for convenience of explanation, and these positions of the terminals are different from those illustrated in FIG. 4A. The terminal Vsub (the back-surface electrode 92) disposed on the back surface of the substrate 80 is illustrated outside the substrate 80 as an extended terminal. When the terminals are disposed in accordance with FIG. 4A, the terminals φ2 and Vga and the current-limiting resistor R2 are disposed at a right end portion of the substrate 80. In addition, the start diode SD may be disposed on the right end portion of the substrate 80.

FIG. 6B, which is a cross-sectional view taken along line VIB-VIB illustrated in FIG. 6A, illustrates the light-emitting diode LED1/the driving thyristor S1, the transfer thyristor T1, the coupling diode D1, and the power supply line resistor Rg1 sequentially from the bottom. Note that the light-emitting diode LED1 and the driving thyristor S1 are stacked together. Herein, the stack of the light-emitting diode LED1 and the driving thyristor S1 is referred to as the light-emitting diode LED1/the driving thyristor S1. The same applies to the other cases.

FIGS. 6A and 6B illustrate major elements and terminals using reference signs thereof. Note that a direction in which the light-emitting diodes LED (light-emitting diodes LED1 to LED4) are arranged on the front surface of the substrate 80 is defined as an x direction, and a direction perpendicular to the x direction is defined as a y direction. A direction from the back surface to the front surface of the substrate 80 is defined as a z direction.

First, the cross-sectional structure of the light-emitting chip C is described with reference to FIG. 6B.

A p-type anode layer 81 (the p-anode layer 81), a voltage reduction layer 90, an n-type gate layer 82 (the n-gate layer 82), a p-type gate layer 83 (the p-gate layer 83), and an n-type cathode layer 84 (the n-cathode layer 84) are sequentially disposed on the p-type substrate 80 (the substrate 80) from the bottom. Note that the aforementioned terms in parentheses are used below. The same applies to the other cases.

A tunnel junction (tunnel diode) layer 85 is disposed on the n-cathode layer 84.

Further, a p-type anode layer 86 (the p-anode layer 86), a light-emitting layer 87, and an n-type cathode layer 88 (the n-cathode layer 88) are disposed on the tunnel junction layer 85.

A light exit protection layer 89 is disposed above the light-emitting diode LED1. The light exit protection layer 89 is formed of an insulating material that transmits light (outgoing light) from the light-emitting diode LED1.

Note that the voltage reduction layer 90 may be a p-anode layer with an impurity concentration similar to that of the p-anode layer 81, just like the p-anode layer 81. In addition, the voltage reduction layer 90 may be an n-gate layer with an impurity concentration similar to that of the n-gate layer 82, just like the n-gate layer 82.

Herein, the p-anode layer 81 is an example of a first semiconductor layer, the n-gate layer 82 is an example of a second semiconductor layer, the p-gate layer 83 is an example of a third semiconductor layer, and the n-cathode layer 84 is an example of a fourth semiconductor layer. In addition, the n-gate layer 82 is an example of a first gate layer, and the p-gate layer 83 is an example of a second gate layer. When the voltage reduction layer 90 is included in a p-anode layer, the voltage reduction layer 90 is included in the first semiconductor layer. When the voltage reduction layer 90 is included in an n-gate layer, the voltage reduction layer 90 is included in the second semiconductor layer. The same applies to the following. In addition, the voltage reduction layer 90 may be an i-layer.

In the light-emitting chip C, a protection layer 91 is disposed to cover the upper surface and the side surfaces of these islands as illustrated in FIG. 6B. The protection layer 91 is formed of a light-transmitting insulating material. These islands are connected to lines such as the power supply line 71, the first transfer signal line 72, the second transfer signal line 73, and the turn-on signal line 75 via through-holes (illustrated as circles in FIG. 6A) formed in the protection layer 91. A description of the protection layer 91 and the through-holes will be omitted below.

As illustrated in FIG. 6B, the back-surface electrode 92 serving as the terminal Vsub is disposed on the back surface of the substrate 80.

The p-anode layer 81, the voltage reduction layer 90, the n-gate layer 82, the p-gate layer 83, the n-cathode layer 84, the tunnel junction layer 85, the p-anode layer 86, the light-emitting layer 87, and the n-cathode layer 88 are semiconductor layers and are sequentially stacked one on top of the other by epitaxial growth. To form plural mutually isolated islands (islands 301, 302, 303, . . . described later), the semiconductor layers between the islands are removed by etching (mesa etching). Note that the p-anode layer 81 may be isolated or may be not isolated. In FIG. 6B, the p-anode layer 81 is partially isolated in the thickness direction. In addition, the p-anode layer 81 may also serve as the substrate 80.

The driving thyristor S, the transfer thyristor T, the coupling diode D, and the power supply line resistor Rg (the driving thyristor S1, the transfer thyristor T1, the coupling diode D1, and the power supply line resistor Rg1 in FIG. 6B) are constituted using the p-anode layer 81, the voltage reduction layer 90, the n-gate layer 82, the p-gate layer 83, and the n-cathode layer 84.

The terms "p-anode layer 81", "voltage reduction layer 90", "n-gate layer 82", "p-gate layer 83", and "n-cathode layer 84" correspond to functions (operations) in the case where these layers constitute the driving thyristor S and the transfer thyristor T. That is, the p-anode layer 81 functions as the anode, the n-gate layer 82 and the p-gate layer 83 function as the gates, and the n-cathode layer 84 functions as the cathode. The voltage reduction layer 90 functions as part of the p-anode layer 81 or part of the n-gate layer 82 as described later. These layers function (operate) differently when they constitute the coupling diode D and the power supply line resistor Rg as described later.

The light-emitting diode LED (the light-emitting diode LED1 in FIG. 6B) is constituted by the p-anode layer 86, the light-emitting layer 87, and the n-cathode layer 88.

The terms "p-anode layer 86" and "n-cathode layer 88" similarly correspond to functions (operations) in the case where these layers constitute the light-emitting diode LED. That is, the p-anode layer 86 functions as the anode, and the n-cathode layer 88 functions as the cathode.

As described below, the plural islands include those not including some of the plural layers, which are the p-anode layer 81, the voltage reduction layer 90, the n-gate layer 82, the p-gate layer 83, the n-cathode layer 84, part or entirety of the tunnel junction layer 85, the p-anode layer 86, the light-emitting layer 87, and the n-cathode layer 88. For example, the island 302 does not include the tunnel junction layer 85, the p-anode layer 86, the light-emitting layer 87, and the n-cathode layer 88.

The plural islands include those not including a part of a layer. For example, the island 302 includes the p-anode layer 81, the voltage reduction layer 90, the n-gate layer 82, the p-gate layer 83, and the n-cathode layer 84 but it includes the n-cathode layer 84 only partially.

A plan layout of the light-emitting chip C will be described next with reference to FIG. 6A.

In the island 301, the driving thyristor S1 and the light-emitting diode LED1 are disposed. In the island 302, the transfer thyristor T1 and the coupling diode D1 are disposed. In the island 303, the power supply line resistor Rg1 is disposed. In an island 304, the start diode SD is disposed. In an island 305, the current-limiting resistor R1 is disposed. In an island 306, the current-limiting resistor R2 is disposed.

Plural islands similar to the islands 301, 302, and 303 are formed in parallel in the light-emitting chip C. In these islands, the driving thyristors S1, S3, S4, . . . ; the light-emitting diodes LED2, LED3, LED4, . . . ; the transfer thyristors T2, T3, T4, . . . ; the coupling diodes D2, D3, D4, . . . ; etc. are provided in the same manner as in the islands 301, 302, and 303.

Now, the islands 301 to 306 are described in detail with reference to FIGS. 6A and 6B.

As illustrated in FIG. 6A, the driving thyristor S1 and the light-emitting diode LED1 are disposed in the island 301.

The driving thyristor S1 is constituted by the p-anode layer 81, the voltage reduction layer 90, the n-gate layer 82, the p-gate layer 83, and the n-cathode layer 84. The driving thyristor S1 uses, as an electrode serving as the gate Gs1 (also referred to as the gate terminal Gs1), a p-type ohmic electrode 331 (p-ohmic electrode 331) which is disposed on the p-gate layer 83 that is exposed by removing the n-cathode layer 88, the light-emitting layer 87, the p-anode layer 86, the tunnel junction layer 85, and the n-cathode layer 84.

On the other hand, the light-emitting diode LED1 is constituted by the p-anode layer 86, the light-emitting layer 87, and the n-cathode layer 88. The light-emitting diode LED1 is stacked on the n-cathode layer 84 of the driving thyristor S1 with the tunnel junction layer 85 interposed therebetween. The light-emitting diode LED1 uses, as the cathode electrode, an n-type ohmic electrode 321 (n-ohmic electrode 321) disposed on the n-cathode layer 88 (region 311).

The p-anode layer 86 includes a current constriction layer 86b (see FIG. 7 described later). The current constriction layer 86b is provided to constrict current that flows through the light-emitting diode LED to a central portion of the light-emitting diode LED. Since a circumferential portion of the light-emitting diode LED often has a defect resulting from mesa etching, non-radiative recombination is likely to occur. Thus, the current constriction layer 86b is provided so that the central portion of the light-emitting diode LED serves as a current passing portion α in which current easily flows and the circumferential portion of the light-emitting diode LED serves as a current blocking portion β in which current does not easily flow. As illustrated in the light-emitting diode LED1 in FIG. 6A, the portion inside a dash line corresponds to the current passing portion α, and the portion outside the dash line corresponds to the current blocking portion β.

To extract light from the central portion of the light-emitting diode LED1, the n-ohmic electrode 321 is provided at the circumferential portion of the light-emitting diode LED1 so that an opening is provided at the central portion.

Note that the current constriction layer 86b will be described later.

Since the current constriction layer 86b reduces electric power consumed by non-radiative recombination, power consumption decreases and light extraction efficiency improves. Note that the light extraction efficiency indicates an amount of light that is successfully extracted per certain amount of electric power.

The transfer thyristor T1 and the coupling diode D1 are disposed in the island 302.

The transfer thyristor T1 is constituted by the p-anode layer 81, the voltage reduction layer 90, the n-gate layer 82, the p-gate layer 83, and the n-cathode layer 84. That is, the transfer thyristor T1 uses, as the cathode terminal, an n-ohmic electrode 323 disposed on the n-cathode layer 84 (region 313) that is exposed by removing the n-cathode layer 88, the light-emitting layer 87, the p-anode layer 86, and the tunnel junction layer 85. Note that the n-ohmic electrode 323 may be disposed on an $n^{++}$-layer 85a of the tunnel junction layer 85 without removing the $n^{++}$-layer 85a of the tunnel junction layer 85. Further, the transfer thyristor T uses, as the terminal serving as the gate Gt1 (also referred to as the gate terminal Gt1), a p-ohmic electrode 332 disposed on the p-gate layer 83 exposed by removing the n-cathode layer 84.

Likewise, the coupling diode D1 disposed in the island 302 is constituted by the p-gate layer 83 and the n-cathode layer 84. That is, the coupling diode D1 uses, as the cathode terminal, an n-ohmic electrode 324 disposed on the n-cathode layer 84 (region 314) exposed by removing the n-cathode layer 88, the light-emitting layer 87, the p-anode layer 86, and the tunnel junction layer 85. Note that the n-ohmic electrode 324 may be disposed on the $n^{++}$-layer 85a of the tunnel junction layer 85 without removing the $n^{++}$-layer 85a of the tunnel junction layer 85. Further, the coupling diode D1 uses, as the anode terminal, the p-ohmic electrode 332 disposed on the p-gate layer 83 exposed by removing the n-cathode layer 84. In this example, the anode terminal of the coupling diode D1 is identical to the gate Gt1 (gate terminal Gt1).

The power supply line resistor Rg1 disposed in the island 303 is constituted by the p-gate layer 83. In this example, the p-gate layer 83 located between a p-ohmic electrode 333 and a p-ohmic electrode 334 disposed on the p-gate layer 83 exposed by removing the n-cathode layer 88, the light-emitting layer 87, the p-anode layer 86, the tunnel junction layer 85, and the n-cathode layer 84 serves as the resistor.

The start diode SD disposed in the island 304 is constituted by the p-gate layer 83 and the n-cathode layer 84. That is, the start diode SD uses, as the cathode terminal, an n-ohmic electrode 325 disposed on the n-cathode layer 84 (region 315) exposed by removing the n-cathode layer 88, the light-emitting layer 87, the p-anode layer 86, and the tunnel junction layer 85. Note that the $n^{++}$-layer 85a of the tunnel junction layer 85 may be left unremoved and the n-ohmic electrode 325 may be disposed on the $n^{++}$-layer 85a of the tunnel junction layer 85. Further, the start diode SD uses, as the anode terminal, a p-ohmic electrode 335 disposed on the p-gate layer 83 exposed by removing the n-cathode layer 84.

The current-limiting resistor R1 disposed in the island 305 and the current-limiting resistor R2 disposed in the island 306 are provided in the same manner as the power supply line resistor Rg1 disposed in the island 303. The p-gate layer 83 located between two p-ohmic electros (assigned no reference signs) serve as the resistors.

Connections between the elements will be described with reference to FIG. 6A.

The turn-on signal line 75 has a trunk portion 75a and plural branch portions 75b. The trunk portion 75a extends in a direction of the line of the light-emitting diodes LED. The branch portions 75b branch off from the trunk portion 75a, and one of the branch portions 75b is connected to the n-ohmic electrode 321 which is the cathode terminal of the light-emitting diode LED1 disposed in the island 301. The same applies to the cathode terminals of the other light-emitting diodes LEDs.

The turn-on signal line 75 is connected to the terminal φI located near the light-emitting diode LED1.

The first transfer signal line 72 is connected to the n-ohmic electrode 323 which is the cathode terminal of the transfer thyristor T1 disposed in the island 302. The first transfer signal line 72 is also connected to the cathode terminals of the odd-numbered transfer thyristors T disposed in islands that are substantially the same as the island 302.

The first transfer signal line 72 is connected to the terminal φ1 through the current-limiting resistor R1 disposed in the island 305.

On the other hand, the second transfer signal line 73 is connected to the n-ohmic electrodes (assigned no reference sign) which are the cathode terminals of the even-numbered transfer thyristors T disposed in islands assigned no reference sign. The second transfer signal line 73 is connected to the terminal φ2 through the current-limiting resistor R2 disposed in the island 306.

The power supply line 71 is connected to the p-ohmic electrode 334 which is one of the terminals of the power supply line resistor Rg1 disposed in the island 303. The power supply line 71 is also connected to one of the terminals of the other power supply line resistors Rg provided in islands that are substantially the same as the island 303. The power supply line 71 is connected to the terminal Vga.

The p-ohmic electrode 331 (the gate terminal Gs1) of the light-emitting diode LED1 disposed in the island 301 is connected to the p-ohmic electrode 332 (the gate terminal Gt1) in the island 302 by a connection line 76.

The p-ohmic electrode 332 (the gate terminal Gt1) is connected to the p-ohmic electrode 333 (the other terminal of the power supply line resistor Rg1) in the island 303 by a connection line 77.

The n-ohmic electrode 324 (the cathode terminal of the coupling diode D1) disposed in the island 302 is connected to the p-ohmic electrode (assigned no reference sign) which is the gate terminal Gt2 of the adjacent transfer thyristor T2 by a connection line 79.

Although a description is omitted here, the same applies to the other light-emitting diodes LED, the other driving thyristors S, the other transfer thyristors T, and the other coupling diodes D.

The p-ohmic electrode 332 (the gate terminal Gt1) in the island 302 is connected to the n-ohmic electrode 325 (the cathode terminal of the start diode SD) disposed in the island 304 by a connection line 78. The p-ohmic electrode 335 (the anode terminal of the start diode SD) is connected to the second transfer signal line 73.

Note that the connections and configurations described above are for the case where the p-type substrate 80 is used. In the case where an n-type substrate is used, the polarity is reversed. In addition, in the case where an i-type substrate is used, a terminal connected to the power supply line 200a that supplies the reference potential Vsub is provided on a side of the substrate on which the transfer unit 101 and the light-emitting unit 102 are disposed. The connections and configurations in this case is the same as those of the case where the p-type substrate is used or of the case where the n-type substrate is used.

Layered Structure of Driving Thyristor S and Light-Emitting Diode LED

Figure 7:
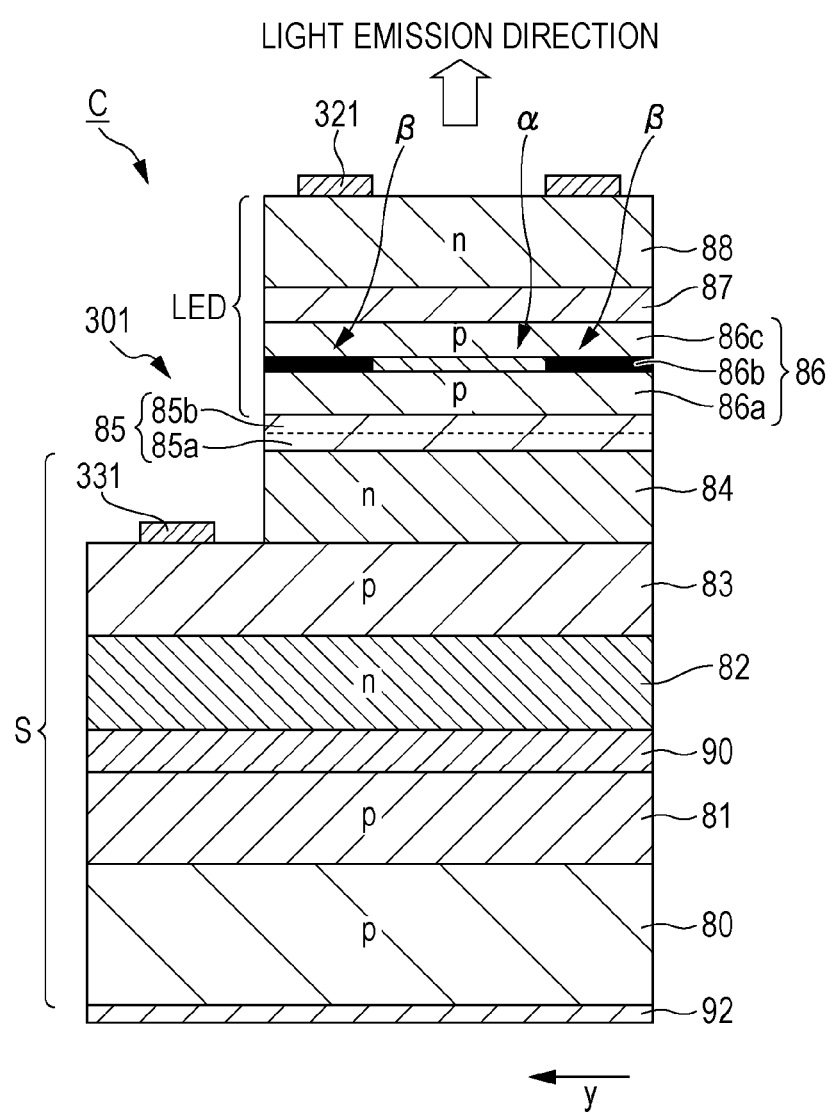
FIG. 7 is an enlarged cross-sectional view of an island in which a driving thyristor and a light-emitting diode are stacked.

FIG. 7 is an enlarged cross-sectional view of the island 301 in which the driving transistor S and the light-emitting diode LED are stacked. Note that FIG. 7 omits illustration of the light exit protection layer 89 and the protection layer 91. The same applies to the other similar drawings.

As described above, the light-emitting diode LED is stacked on the driving thyristor S with the tunnel junction layer 85 interposed therebetween. That is, the driving thyristor S and the light-emitting diode LED are connected in series. The light-emitting diode LED emits light in the z direction which is indicated by an arrow representing the light emission direction.

The driving thyristor S is constituted by the p-anode layer 81, the voltage reduction layer 90, the n-gate layer 82, the p-gate layer 83, and the n-cathode layer 84. That is, the driving thyristor S has a structure in which the voltage reduction layer 90 is added to a pnpn four-layer structure.

The voltage reduction layer 90 may be part of the p-anode layer 81 and may be a p-layer with an impurity concentration similar to that of the p-anode layer 81. Alternatively, the voltage reduction layer 90 may be part of the n-gate layer 82 and may be an n-layer with an impurity concentration similar to that of the n-gate layer 82. Alternatively, the voltage reduction layer 90 may be an i-layer.

The tunnel junction layer 85 is constituted by the $n^{++}$-layer 85a doped with an n-type impurity (dopant) at a high concentration and a $p^{++}$-layer 85b doped with a p-type impurity at a high concentration.

The light-emitting diode LED is constituted by the p-anode layer 86, the light-emitting layer 87, and the n-cathode layer 88. Note that the light-emitting layer 87 has a quantum well structure in which well layers and barrier layers are alternately stacked. Note that the light-emitting layer 87 may be an i-layer. Alternatively, the light-emitting layer 87 may have a structure other than the quantum well structure, for example, a quantum wire structure or a quantum dot structure.

The p-anode layer 86 is constituted by a lower p-layer 86a, the current constriction layer 86b, and an upper p-layer 86c that are sequentially stacked. The current constriction layer 86b is constituted by the current passing portion α and the current blocking portion β. As illustrated in FIG. 6A, the current passing portion α is provided at the central portion of the light-emitting diode LED, and the current blocking portion β is provided at the circumferential portion of the light-emitting diode LED.

Voltage Reduction Layer 90

Figure 8A:
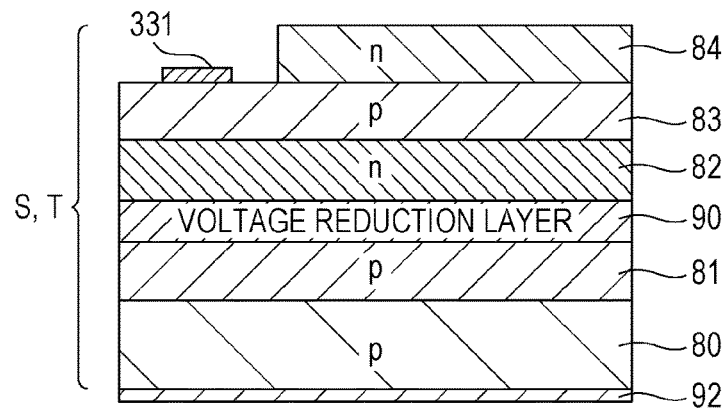
FIGS. 8A to 8C illustrate structures and characteristics of thyristors, specifically.
Figure 8B:
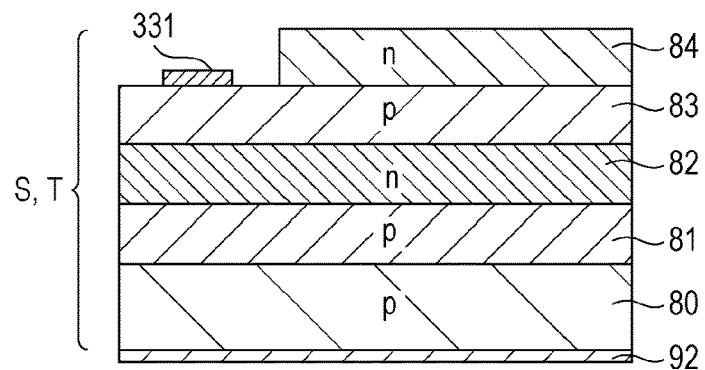
Figure 8C:
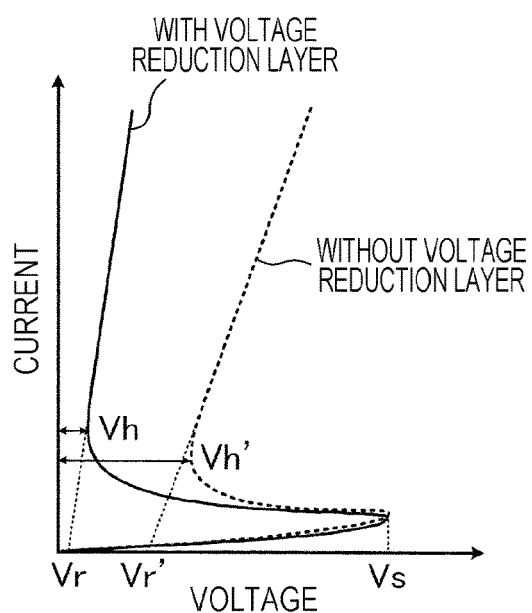

FIGS. 8A to 8C illustrate the structure and characteristics of thyristors. Specifically, FIG. 8A is a cross-sectional view of the thyristor according to the first exemplary embodiment that includes the voltage reduction layer 90. FIG. 8B is a cross-sectional view of a thyristor not including the voltage reduction layer 90. FIG. 8C illustrates characteristics of the thyristors. Each of FIGS. 8A and 8B illustrates a cross-section of the driving thyristor S or the transfer thyristor T above which the light-emitting diode LED is not stacked. Note that the driving thyristor S above which the light-emitting diode LED is stacked has similar characteristics.

As illustrated in FIG. 8A, the thyristor (the transfer thyristor T or the driving thyristor S) according to the first exemplary embodiment includes the voltage reduction layer 90 located between the p-anode layer 81 and the n-gate layer 82. Note that the voltage reduction layer 90 serves as part of the p-anode layer 81 if the voltage reduction layer 90 is a p-layer with an impurity concentration similar to that of the p-anode layer 81 or serves as part of the n-gate layer 82 if the voltage reduction layer 90 is an p-layer with an impurity concentration similar to that of the n-gate layer 82. The voltage reduction layer 90 may be an i-layer.

The thyristor illustrated in FIG. 8B does not include the voltage reduction layer 90.

The rising voltage Vr of a thyristor is determined by the smallest bandgap energy among bandgap energies of semiconductor layers constituting the thyristor. Note that the rising voltage Vr of a thyristor is a voltage obtained when current flowing through the thyristor in an on-state is extrapolated to the voltage axis.

As illustrated in FIG. 8C, the thyristor according to the first exemplary embodiment includes the voltage reduction layer 90 which is a layer having a smaller bandgap energy than the p-anode layer 81, the n-gate layer 82, the p-gate layer 83, and the n-cathode layer 84. Thus, the rising voltage Vr of the thyristor according to the first exemplary embodiment is lower than rising voltage Vr' of the thyristor not including the voltage reduction layer 90. Further, the voltage reduction layer 90 is a layer having a bandgap smaller than a bandgap of the light-emitting layer 87, for example. The thyristor according to the first exemplary embodiment is not used as a light-emitting component but functions as a part of a driving circuit that drives a light-emitting component, such as the light-emitting diode LED. Thus, the bandgap is determined independently of the wavelength of light actually emitted by the light-emitting component. Accordingly, the rising voltage Vr of the thyristor is reduced by providing the voltage reduction layer 90 having a bandgap smaller than the bandgap of the light-emitting layer 87. This consequently reduces voltage applied to the thyristor and the light-emitting element when the thyristor and the light-emitting element are in the on-state.

Figure 9:
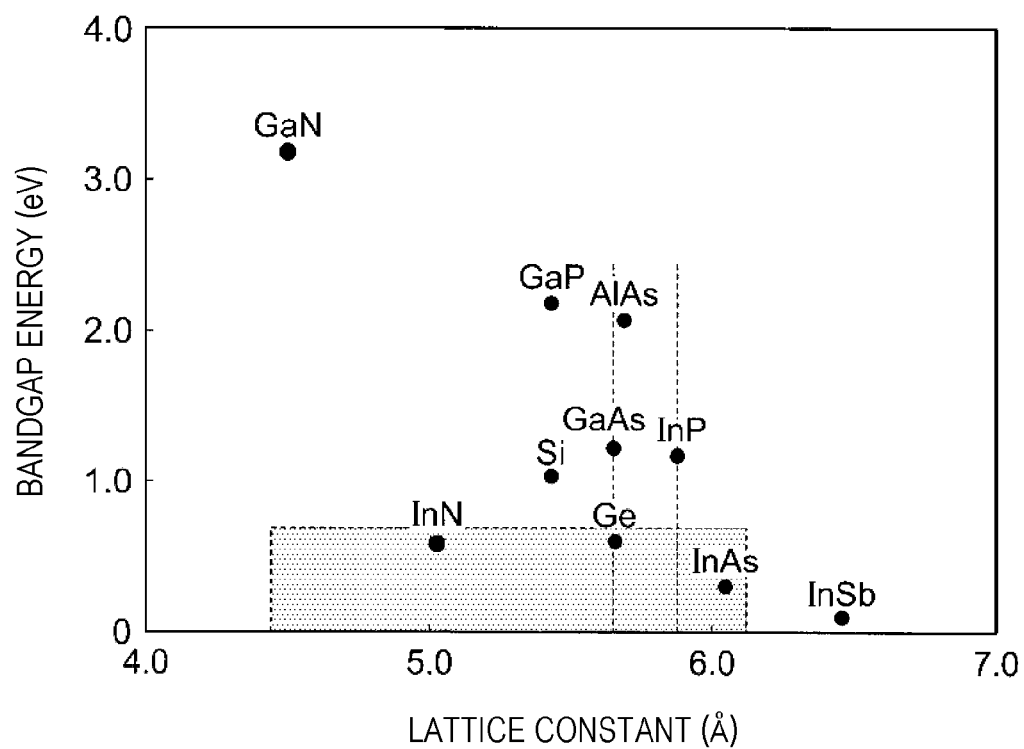
FIG. 9 describes bandgap energies of materials of semiconductor layers.

FIG. 9 illustrates bandgap energies of materials of semiconductor layers.

The lattice constant of GaAs is about 5.65 Å. The lattice constant of AlAs is about 5.66 Å. Thus, a material having a lattice constant close to this lattice constant is successfully epitaxially grown on a GaAs substrate. For example, Ge or AlGaAs, which is a compound of GaAs and AlAs, is successfully epitaxially grown on a GaAs substrate.

In addition, the lattice constant of InP is about 5.87 Å. A material having a lattice constant close to this lattice constant is successfully epitaxially grown on an InP substrate.

GaN has different lattice constants depending on the growth face. The lattice constant of the a-plane is 3.19 Å and the lattice constant of the c-plane is 5.17 Å. A material having a lattice constant close to one of these lattice constants is successfully epitaxially grown on a GaN substrate.

Materials having bandgap energies that reduce the rising voltage of the thyristor for GaAs, InP, and GaN are in a shaded range in FIG. 9. That is, when a material in the shaded range is used as a layer of the thyristor, the rising voltage Vr of the thyristor becomes equal to bandgap energy of the material in the shaded range.

For example, the bandgap energy of GaAs is about 1.43 eV. Thus, the rising voltage Vr of the thyristor is about 1.43 V without the voltage reduction layer 90. However, when a material in the shaded range is used as or included in a layer of the thyristor, the rising voltage Vr of the thyristor is successfully set to be higher than 0 V and lower than 1.43 V (0 V<Vr<1.43 V).

Consequently, power consumption is reduced when the thyristor is in the on-state.

The materials in the shaded range include Ge which has a bandgap energy of about 0.67 eV for GaAs. In addition, the materials include InAs which has a bandgap energy of about 0.36 eV for InP. In addition, materials having a smaller bandgap energy such as a compound of GaAs and InP, a compound of InN and InSb, and a compound of InN and InAs may be used for a GaAs substrate or an InP substrate. In particular, a GaInNAs-based mixed compound is suitable. These may contain Al, Ga, As, P, Sb, etc. In addition, GaNP may serve as the voltage reduction layer 90 for GaN. In addition, (1) an InN layer or an InGaN layer obtained by metamorphic growth, for example; (2) quantum dots of InN, InGaN, InNAs, or InNSb; or (3) an InAsSb layer having a lattice constant equivalent to the doubled lattice constant of GaN (the a-plane) may be used as the voltage reduction layer 90. These may contain Al, Ga, N, As, P, Sb, etc.

The description has been given using the rising voltages Vr and Vr' of the thyristors in this example. The same applies to hold voltages Vh and Vh' that are the minimum voltages applied to maintain the thyristors in the on-state and to voltages applied to the on-state thyristors (see FIG. 8C).

On the other hand, the switching voltage Vs (see FIG. 8C) of a thyristor is determined by a depletion layer of a reverse-biased semiconductor layer. Thus, the influence of the voltage reduction layer 90 on the switching voltage Vs of the thyristor is small.

That is, the voltage reduction layer 90 maintains the switching voltage Vs of the thyristor and reduces the rising voltage Vr (reduces the rising voltage Vr' to the rising voltage Vr). Consequently, the voltage applied to the on-state thyristor is reduced, and power consumption is reduced. The switching voltage Vs of the thyristor is set to a given value by adjusting the materials and impurity concentrations of the p-anode layer 81, the n-gate layer 82, the p-gate layer 83, and the n-cathode layer 84. Note that the switching voltage Vs changes depending on the position at which the voltage reduction layer 90 is inserted.

Tunnel Junction Layer 85

Figure 10A:
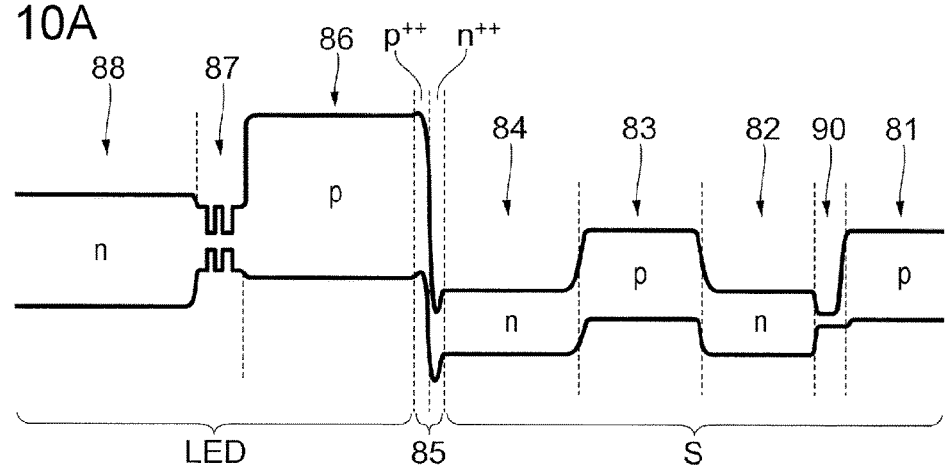
FIGS. 10A to 10C illustrate a layered structure of a driving thyristor and a light-emitting diode, specifically.
Figure 10B:
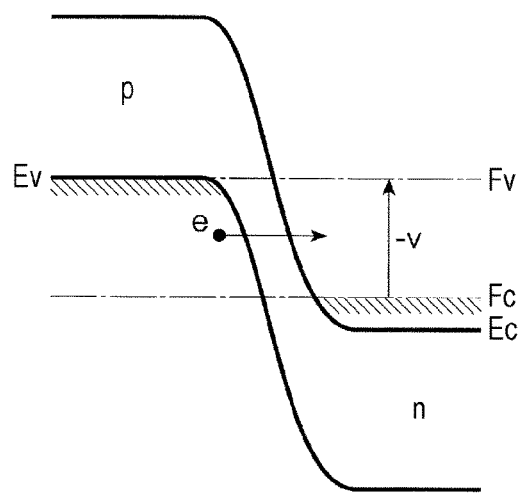
Figure 10C:
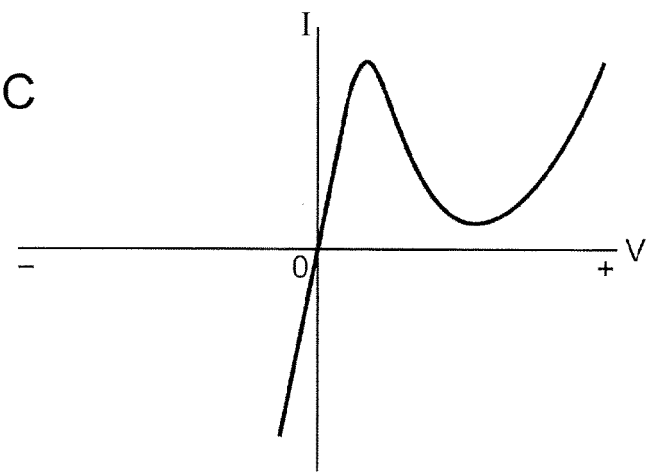

FIGS. 10A, 10B, and 10C further describe the layered structure of the driving thyristor S and the light-emitting diode LED. Specifically, FIG. 10A is a schematic energy band diagram of the layered structure of the driving thyristor S and the light-emitting diode LED, FIG. 10B is an energy band diagram of the tunnel junction layer 85 in the reverse-biased state, and FIG. 10C illustrates current-voltage characteristics of the tunnel junction layer 85.

When voltage is applied across the n-ohmic electrode 321 and the back-surface electrode 92 illustrated in FIG. 7 so that the light-emitting diode LED and the driving thyristor S are forward-biased as illustrated in the energy band diagram of FIG. 10A, the $n^{++}$-layer $85a$ and the $p^{++}$-layer $85b$ of the tunnel junction layer 85 are reverse-biased.

The tunnel junction layer 85 (tunnel junction) includes a junction of the $n^{++}$-layer $85a$ doped with an n-type impurity at a high concentration and the $p^{++}$-layer $85b$ doped with a p-type impurity at a high concentration. Therefore, the width of the depletion region is small. When the tunnel junction layer 85 is forward-biased, electrons tunnel from the conduction band on the $n^{++}$-layer $85a$ side to the valence band on the $p^{++}$-layer $85b$ side. In this case, the tunnel junction layer 85 exhibits negative resistance characteristics.

On the other hand, when the tunnel junction layer 85 (tunnel junction) is reverse-biased (−V) as illustrated in FIG. 10B, a potential Ev of the valence band on the $p^{++}$-layer $85b$ side becomes higher than a potential Ec of the conduction band on the $n^{++}$-layer $85a$ side. Then, electrons tunnel from the valence band on the $p^{++}$-layer $85b$ side to the conduction band on the $n^{++}$-layer $85a$ side. As the absolute value of the reverse bias voltage (−V) increases, electrons more easily tunnel. That is, current easily flows through the tunnel junction layer 85 (tunnel junction) in the reverse-biased state as illustrated in FIG. 10C.

Thus, current flows between the driving thyristor S and the light-emitting diode LED in response to turn-on of the driving thyristor S even when the tunnel junction layer 85 is reverse-biased as illustrated in FIG. 10A. Consequently, the light-emitting diode LED emits light (turns on).

When the transfer thyristor T connected to the driving thyristor S turns on and enters the on-state, the driving thyristor S is ready to enter the on-state. Then, the turn-on signal ϕI changes to "L", the driving thyristor S turns on and enters the on-state and causes the light-emitting diode LED to turn on (sets the light-emitting diode LED in the on-state). Therefore, the term "driving thyristor" is used herein.

Thyristor

A basic operation of a thyristor (the transfer thyristor T or the driving thyristor S) will be described next. As described before, a thyristor is a semiconductor element having three terminals, i.e., the anode terminal (anode), the cathode terminal (cathode), and the gate terminal (gate), and is constituted by stacking p-type semiconductor layers (the p-anode layer 81 and the p-gate layer 83) and n-type semiconductor layers (the n-gate layer 82 and the n-cathode layer 84) composed for example of GaAs, GaAlAs, AlAs, and the voltage reduction layer 90 formed of Ge or containing Ge on the substrate 80. As described before, the voltage reduction layer 90 serves as a p-layer or an n-layer. A description is given here on the assumption that a forward potential (diffusion potential) of a pn junction formed by a p-type semiconductor layer and an n-type semiconductor layer is equal to 1.5 V, for example.

In addition, the description is given on the assumption that the voltage applied across the cathode and the anode of the on-state thyristor is equal to 1V, which is smaller than the forward potential Vd (1.5 V) of the pn junction because of the voltage reduction layer 90. If the voltage reduction layer 90 is not included, the voltage applied across the cathode and the anode of the on-state thyristor is equal to the forward voltage Vd (1.5 V) of the pn junction. In the following description, the thyristor includes the voltage reduction layer 90 and thus the voltage applied across the cathode and the anode of the on-state thyristor is reduced by 0.5 V. Note that the voltage applied across the cathode and the anode of the on-state thyristor is determined by the voltage reduction layer 90 used.

The following description is given on the assumption that the reference potential Vsub supplied to the back-surface electrode 92 (see FIGS. 5 to 6B) serving as the terminal Vsub is a high-level potential (hereinafter, referred to as "H") of 0 V and the power supply potential Vga supplied to the terminal Vga is a low-level potential (hereinafter, referred to as "L") of −3.3 V.

The anode of the thyristor has the reference potential Vsub ("H" (0 V)) that is supplied to the back-surface electrode 92.

When a potential lower than a threshold voltage (a negative potential having a greater absolute value) is applied to the cathode of a thyristor that is in an off-state in which no current flows between the anode and the cathode, the thyristor enters an on-state (turns on). Note that the threshold voltage of the thyristor is equal to a value obtained by subtracting the forward potential Vd (1.5 V) of the pn junction from the gate potential.

When the thyristor enters the on-state, the gate of the thyristor has a potential close to the potential of the anode terminal. Since the potential of the anode is set to the reference potential Vsub ("H" (0 V)) in this case, the potential of the gate becomes equal to 0 V ("H"). In addition, the potential of the cathode of the on-state thyristor becomes equal to −1 V.

When the cathode of the on-state thyristor has a potential (a potential having a smaller absolute value, 0 V, or a positive potential) higher than a potential necessary to maintain the thyristor in the on-state (a potential close to −1 V), the on-state thyristor enters the off-state (turns off).

On the other hand, when a potential (a negative potential having a greater absolute value) that is lower than the potential necessary to maintain the thyristor in the on-state is continuously applied to the cathode of the on-state thyristor and current that successfully maintains the on-state (maintaining current) is supplied to the thyristor, the thyristor is maintained in the on-state.

The driving thyristor S and the light-emitting diode LED are stacked and are connected in series. Thus, the voltage applied to the cathode (the n-cathode layer 84) of the driving thyristor S is equal to a voltage obtained by dividing the potential of the turn-on signal ϕI by the driving thyristor S and the light-emitting diode LED. The description is given here on the assumption that −3.3 V is applied to the driving thyristor S when the driving thyristor S is in the off-state. The voltage ("Lo" described later) of the turn-on signal ϕI that is applied to turn on the light-emitting diode LED is equal to −5 V. Consequently, 1.7 V is applied across the anode and the cathode of the light-emitting diode LED. The following description is given on the assumption that the voltage applied to the light-emitting diode LED is equal to −1.7 V, for example. Note that the voltage applied to the light-emitting diode LED is changed depending on the wavelength and amount of light to be emitted. In such a case, the voltage ("Lo") of the turn-on signal ϕI supplied to the terminal ϕI may be adjusted.

Since the n-gate layer 82 and the p-gate layer 83 of the thyristor is constituted by a semiconductor, such as GaAs, the thyristor emits light between the n-gate layer 82 and the p-gate layer 83 in the on-state in some cases. The amount of light emitted by the thyristor is determined by an area of the cathode and current that flows between the cathode and the anode. Thus, when the light emitted by the thyristor is not used, unnecessary light may be reduced by reducing the area of the cathode or blocking the light with an electrode (the n-ohmic electrode 323 of the transfer thyristor T1) in the transfer thyristor T, for example.

An operation of the light-emitting device 65 will be described next.

As described before, the light-emitting device 65 includes the light-emitting chips C1 to C40 (see FIGS. 3 to 4B).

Since the light-emitting chips C1 to C40 are driven in parallel, it is sufficient to describe the operation of the light-emitting chip C1.

Timing Chart

Figure 11:
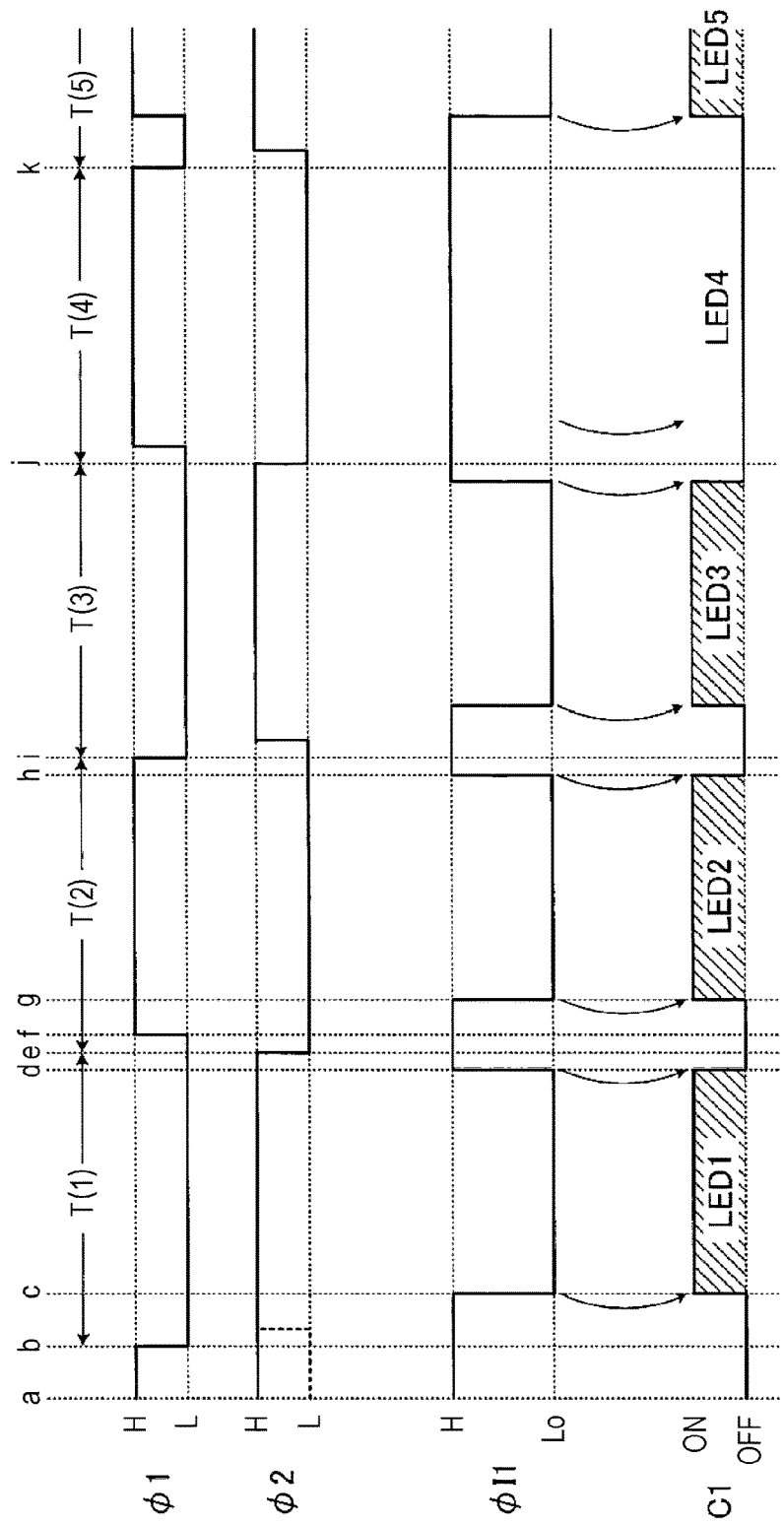
FIG. 11 is a timing chart describing operations of the light-emitting device and the light-emitting chip.

FIG. 11 is a timing chart describing the operation of the light-emitting device 65 and the operation of the light-emitting chip C.

FIG. 11 is a timing chart of a period in which on and off of five light-emitting diodes LED (i.e., the light-emitting diodes LED1 to LED5) of the light-emitting chip C1 are controlled (hereinafter, referred to turn-on control). Note that the light-emitting diodes LED1, LED2, LED3, and LED5 of the light-emitting chip C1 are turned on and the light-emitting diode LED4 is maintained to be turned off (off) in FIG. 11.

In FIG. 11, time passes in the alphabetical order from time a to time k. On and off of the light-emitting diodes LED1, LED2, LED3, and LED4 are controlled (turn-on control is performed) in periods T(1), T(2), T(3), and T(4), respectively. Turn-on control is performed on the light-emitting diodes LED assigned the numbers of 5 and greater in the similar manner.

It is assumed here that the periods T(1), T(2), T(3), . . . have equal durations and are referred to as periods T when they are not distinguished from one another.

Each of the first transfer signal ϕ1 that is sent to the terminal ϕ1 (see FIGS. 5 to 6B) and the second transfer signal ϕ2 that is sent to the terminal ϕ2 (see FIGS. 5 to 6B) is a signal having two potentials of "H" (0 V) and "L" (−3.3 V). Each of the first transfer signal ϕ1 and the second transfer signal φ2 has a waveform that iterates in a unit of two consecutive periods T (for example, the periods T(1) and T(2)).

Hereinafter, the expressions "H" (0 V) and "L" (−3.3 V) are sometimes simply referred to as "H" and "L", respectively.

The first transfer signal φ1 changes from "H" (0V) to "L" (−3.3 V) at start time b of the period T(1) and changes from "L" to "H" at time f. The first transfer signal φ1 then changes from "H" to "L" at end time i of the period T(2).

The second transfer signal φ2 is at "H" (0V) at the start time b of the period T(1) and changes from "H" (0V) to "L" (−3.3 V) at time e. Then, the second transfer signal φ2 changes from "L" to "H" slightly after the end time i of the period T(2).

Comparison of the first transfer signal φ1 and the second transfer signal φ2 indicates that the second transfer signal φ2 is a signal obtained by shifting the first transfer signal φ1 behind by the period T on the time axis. The waveform of the second transfer signal φ2 that is indicated by a dotted line in the period T(1) and the waveform in the period T(2) iterate in the period T(3) and subsequent periods. The waveform of the second transfer signal φ2 in the period T(1) is different from that in the period T(3) and thereafter because the period T(1) is a period in which the light-emitting device 65 starts the operation.

A set of transfer signals (i.e., the first transfer signal φ1 and the second transfer signal φ2) specifies the light-emitting diode LED assigned the same number as the number of the on-state transfer thyristor T to be a target of on/off control (turn-on control) by propagating the on-state of the transfer thyristors T in the numbered order as described later.

The turn-on signal φI1 that is sent to the terminal φI of the light-emitting chip C1 will be described next. Note that turn-on signals φI2 to φI40 are sent to the other light-emitting chips C2 to C40, respectively. The turn-on signal φI1 is a signal having two potentials of "H" (0V) and "Lo" (−5 V).

The turn-on signal φI1 in the period T(l) in which turn-on control is performed on the light-emitting diode LED1 of the light-emitting chip C1 will be described. The turn-on signal φI1 is at "H" (0V) at the start time b of the period T(l) and changes from "H" (0V) to "Lo" (−5V) at time c. Then, the turn-on signal φI1 changes from "Lo" to "H" at time d and maintains "H" at time e.

The operation of the light-emitting device 65 and the operation of the light-emitting chip C1 will be described in accordance with the timing chart illustrated in FIG. 11 with reference to FIGS. 4A to 5. Note that the periods T(l) and T(2) in which turn-on control is performed on the light-emitting diodes LED1 and LED2 will be described below.
(1) Time a
Light-Emitting Device 65

At time a, the reference potential supplying unit 160 of the signal generation circuit 110 of the light-emitting device 65 sets the reference potential Vsub to "H" (0 V). The power supply potential supplying unit 170 sets the power supply potential Vga to "L" (−3.3 V). Then, the power supply line 200a on the circuit board 62 of the light-emitting device 65 has the reference potential Vsub ("H" (0 V)), and each of the terminals Vsub of the light-emitting chips C1 to C40 has "H". Likewise, the power supply line 200b has the power supply potential Vga ("L" (−3.3 V)), and each of the terminals Vga of the light-emitting chips C1 to C40 has "L" (see FIG. 4B). As a result, each of the power supply lines 71 of the light-emitting chips C1 to C40 has "L" (see FIG. 5).

Then, the transfer signal generation unit 120 of the signal generation circuit 110 sets the first transfer signal φ1 and the second transfer signal φ2 to "H" (0 V). Then, the first transfer signal line 201 and the second transfer signal line 202 have "H" (see FIG. 4B). Consequently, the terminals φ1 and φ2 of each of the light-emitting chips C1 to C40 have "H". The first transfer signal line 72 that is connected to the terminal φ1 through the current-limiting resistor R1 has "H", and the second transfer signal line 73 that is connected to the terminal φ1 through the current-limiting resistor R2 also has "H" (see FIG. 5).

Further, the turn-on signal generation unit 140 of the signal generation circuit 110 sets the turn-on signals φI1 to φI40 to "H" (0 V). Then, the turn-on signal lines 204-1 to 204-40 have "H" (see FIG. 4B). Consequently, the terminal φI of each of the light-emitting chips C1 to C40 has "H" through the current-limiting resistor RI, and the turn-on signal line 75 connected to the terminal φI also has "H" (0 V) (see FIG. 5).
Light-Emitting Chip C1

Since the anode terminals of the transfer thyristors T and the driving thyristors S are connected to the terminal Vsub, the potentials of the anode terminals are set to "H".

Since the cathodes of the odd-numbered transfer thyristors T1, T3, T5, . . . are connected to the first transfer signal line 72, the potentials thereof are set to "H" (0 V). Since the cathodes of the even-numbered transfer thyristors T2, T4, T6, . . . are connected to the second transfer signal line 73, the potentials thereof are set to "H". Since both the anode and the cathode of each of the transfer thyristors T have "H", the transfer thyristor T is in the off-state.

The cathode terminals of the light-emitting diodes LED are connected to the turn-on signal line 75 having "H" (0 V). That is, each light-emitting diode LED and the corresponding driving thyristor S are connected in series to each other with the tunnel junction layer 85 interposed therebetween. Since the cathode of the light-emitting diode LED has "H" and the anode of the driving thyristor S has "H", the light-emitting diode LED and the driving thyristor S are in the off-state.

The gate Gt1 is connected to the cathode of the start diode SD as described before. The gate Gt1 is connected to the power supply line 71 having the power supply potential Vga ("L" (−3.3 V)) through the power supply line resistor Rg1. The anode terminal of the start diode SD is connected to the second transfer signal line 73 and is connected to the terminal φ2 having "H" (0 V) through the current-limiting resistor R2. Thus, the start diode SD is forward biased, and the cathode (gate Gt1) of the start diode SD has a potential (−1.5 V) obtained by subtracting the forward potential Vd (1.5 V) of the pn junction from the potential ("H" (0 V)) of the anode of the start diode SD. If the potential of the gate Gt1 changes to −1.5 V, the coupling diode D1 is forward biased since the anode (gate Gt1) thereof has −1.5 V and the cathode thereof is connected to the power supply line 71 ("L" (−3.3 V)) through the power supply line resistor Rg2. Thus, the potential of the gate Gt2 becomes equal to −3 V obtained by subtracting the forward potential Vd (1.5 V) of the pn junction from the potential (−1.5 V) of the gate Gt1. However, there is no influence of the anode of the start diode SD having "H" (0 V) on the gates Gt assigned the numbers of 3 and greater, and these gates Gt have "L" (−3.3 V) which is the potential of the power supply line 71.

Since the gates Gt serve as the gates Gs, the gates Gs have a potential equal to the potential of the gates Gt. Thus, the threshold voltages of the transfer thyristors T and the driving thyristors S are equal to a value obtained by subtracting the forward potential Vd (1.5 V) of the pn junction from the potential of the gates Gt and Gs. That is, the threshold voltages of the transfer thyristor T1 and the driving thyristor S1 are equal to −3 V, the threshold voltages of the transfer thyristor T2 and the driving thyristor S2 are equal to −4.5 V, and the threshold voltages of the transfer thyristors T and the driving thyristors S assigned the numbers of 3 and greater are equal to −4.8 V.

(2) Time b

At the time b illustrated in FIG. 11, the first transfer signal ϕ1 changes from "H" (0 V) to "L" (−3.3 V). In response to this, the light-emitting device 65 starts the operation.

Upon the first transfer signal ϕ1 changing from "H" to "L", the potential of the first transfer signal line 72 changes from "H" (0 V) to "L" (−3.3 V) through the terminal ϕ1 and the current-limiting resistor R1. Then, the transfer thyristor T1 whose threshold voltage is equal to −3 V turns on. However, since the transfer thyristors T that have the cathode terminal connected to the first transfer signal line 72 and that are assigned odd numbers of 3 and greater have the threshold voltage of −4.8 V, they do not turn on. In addition, the even-numbered transfer thyristors T do not turn because the second transfer signal ϕ2 is at "H" (0 V) and the second transfer signal line 73 has "H" (0 V).

In response to turn-on of the transfer thyristor T1, the potential of the first transfer signal line 72 becomes equal to −1 V from the potential ("H" (0 V)) of the anode.

In response to turn-on of the transfer thyristor T, the potential of the gate Gt1/Gs1 becomes equal to "H" (0 V) that is the potential of the anode of the transfer thyristor T1. In addition, the potential of the gate Gt2 (gate Gs2) becomes equal to −1.5 V, the potential of the gate Gt3 (gate Gs3) becomes equal to −3 V, and the potential of the gate Gt (gate Gs) assigned the number of 4 or greater becomes equal to "L".

Consequently, the threshold voltage of the driving thyristor S1 becomes equal to −1.5 V, the threshold voltages of the transfer thyristor T2 and the driving thyristor S2 become equal to −3 V, the threshold voltages of the transfer thyristor T3 and the driving thyristor S3 become equal to −4.5 V, and the threshold voltages of the transfer thyristor T and the driving thyristor S assigned the number of 4 or greater become equal to −4.8 V.

However, since the first transfer signal line 72 has −1 V due to the on-state transfer thyristor T1, the odd-numbered transfer thyristors T that are in the off-state do not turn on. Since the second transfer signal line 73 has "H" (0 V), the even-numbered transfer thyristors T do not turn on. In addition, the turn-on signal line 75 has "H" (0 V), none of the light-emitting diodes LED turn on.

Immediately after the time b (indicating time at which a steady state is achieved after a change in the thyristor and the like has occurred in response to a change in the potential of the signal at the time b), the transfer thyristor T1 is in the on-state and the other transfer thyristors T, the driving thyristors S, and the light-emitting diodes LED are in the off-state.

(3) Time c

At the time c, the turn-on signal ϕI1 changes from "H" (0 V) to "Lo" (−5V).

Upon the turn-on signal ϕI1 changing from "H" to "Lo", the potential of the turn-on signal line 75 changes from "H" (0 V) to "Lo" (−5 V) through the current-limiting resistor RI and the terminal ϕI. Then, the divided voltage applied across the anode and the cathode of the driving thyristor S becomes equal to −3.3 V. Then, the driving thyristor S1 having a threshold voltage of −1.5 V turns on and the light-emitting diode LED1 turns on (emits light). Since the voltage applied across the anode and the cathode of the driving thyristor S1 consequently becomes equal to −1 V, the potential of the turn-on signal line 75 becomes equal to a potential close to −2.7 V. The threshold voltage of the driving thyristor S2 is equal to −3 V. Since the voltage applied to the driving thyristor S2 is equal to −1 V obtained by adding 1.7 V, which is the voltage applied to the light-emitting diode LED, to −2.7 V, the driving thyristor S2 does not turn on.

Immediately after the time c, the transfer thyristor T1 and the driving thyristor S1 are in the on-state, and the light-emitting diode LED1 is on (is emitting light).

Note that the driving thyristor S1 is ready to enter the on-state as a result of turn-on of the transfer thyristor T1 at the time b.

(4) Time d

At the time d, the turn-on signal ϕI1 changes from "Lo" (−5 V) to "H" (0 V).

Upon the turn-on signal ϕI1 changing from "Lo" to "H", the potential of the turn-on signal line 75 changes from −2.7 V to "H" (0 V) through the current-limiting resistor RI and the terminal ϕI. Then, since both the cathode of the light-emitting diode LED1 and the anode of the driving thyristor S1 have "H", the driving thyristor S1 turns off and the light-emitting diode LED1 turns off (off). A period for which the light-emitting diode LED1 is on is a period for which the turn-on signal ϕI1 is at "Lo" (−5 V) from the time c at which the turn-on signal ϕI1 changes from "H" to "Lo" to the time d at which the turn-on signal ϕI1 changes from "Lo" to "H".

Immediately after the time d, the transfer thyristor T1 is in the on-state.

(5) Time e

At the time e, the second transfer signal ϕ2 changes from "H" (0V) to "L" (−3.3 V). At the time e, the period T(1) in which turn-on control is performed on the light-emitting diode LED1 ends, and the period T(2) in which turn-on control is performed on the light-emitting diode LED2 starts.

Upon the second transfer signal ϕ2 changes from "H" to "L", the potential of the second transfer signal line 73 changes to −3.3 V through the terminal ϕ2. As described before, since the threshold voltage of the transfer thyristor T2 is equal to −3 V, the transfer thyristor T2 turns on. Consequently, the potential of the gate terminal Gt2 (gate terminal Gs2) becomes equal to "H" (0 V), the potential of the gate Gt3 (gate Gs3) becomes equal to −1.5 V, and the potential of the gate Gt4 (gate Gs4) becomes equal to −3 V. In addition, the potential of the gate Gt (gate Gs) assigned the number of 5 or greater becomes equal to −3.3 V.

Immediately after the time e, the transfer thyristors T1 and T2 are in the on-state.

(6) Time f

At the time f, the first transfer signal ϕ1 changes from −1 V to "H" (0 V).

Upon the first transfer signal ϕ1 changing from −1 V to "H", the potential of the first transfer signal line 72 changes from −1 V to "H" through the terminal ϕ1. Then, both the anode and the cathode of the on-state transfer thyristor T1 have "H", and the transfer thyristor T1 turns off. Then, the potential of the gate Gt1 (gate Gs1) changes toward the power supply voltage Vga ("L" (−3.3 V)) of the power supply line 71 through the power supply line resistor Rg1. Consequently, the coupling diode D1 enters a state in which a potential is applied in a direction in which current does not flow (is reversely biased). Thus, there is no longer an influence of the gate Gt2 (gate Gs2) having "H" (0 V) on the gate Gt1 (gate Gs1). That is, the transfer thyristor T having the gate Gt connected through the reverse-biased coupling diode D has the threshold of −4.8 V and no longer turns on with the first transfer signal φ1 or the second transfer signal φ2 that is at "L" (−3.3 V).

Immediately after the time f, the transfer thyristor T2 is in the on-state.

(7) Other Times

Upon the turn-on signal φI1 changing from "H" (0 V) to "Lo" (−5 V) at time g, the driving thyristor S2 turns on and the light-emitting diode LED2 turns on (emits light) just like the driving thyristor S1 and the light-emitting diode LED1 at the time c.

Then, upon the turn-on signal φI1 changing from "Lo" (−5 V) to "H" (0 V) at time h, the driving thyristor S2 turns off and the light-emitting diode LED2 turns off just like the driving thyristor S1 and the light-emitting diode LED1 at the time d.

Further, upon the first transfer signal φ1 changing from "H" (0 V) to "L" (−3.3 V) at time i, the transfer thyristor T3 having a threshold voltage of −3 V turns on just like the transfer thyristor T1 at the time b or the transfer thyristor T2 at the time e. At the time i, the period T(2) in which turn-on control is performed on the light-emitting diode LED2 ends and the period T(3) in which turn-on control is performed on the light-emitting diode LED3 starts.

The above-described operation is repeated thereafter.

Note that if the light-emitting diode LED is maintained off (turned off) instead of turning on, the turn-on signal φI is maintained at "H" (0 V) just like the turn-on signal φI1 from time j to time k in the period T(4) in which turn-on control is performed on the light-emitting diode LED4 in FIG. 11. With this configuration, even if the threshold of the driving thyristor S4 is equal to −1.5 V, the driving thyristor S4 does not turn on and the light-emitting diode LED4 is maintained off (turned off).

As described above, the gate terminals Gt of the transfer thyristors T are connected to each other by the corresponding coupling diodes D. Thus, when the potential of the gate Gt changes, the potential of the gate Gt that is connected to the potential-changed gate Gt through the forward-biased coupling diode D also changes. Then, the threshold voltage of the transfer thyristor T having the potential changed gate also changes. The transfer thyristor T turns on at a timing at which the first transfer signal φ1 or the second transfer signal φ2 changes from "H" (0 V) to "L" (−3.3 V) if the threshold voltage thereof is higher than "L" (−3.3 V) (a negative value having a smaller absolute value).

Then, since the driving thyristor S whose gate Gs is connected to the gate Gt of the on-state transfer thyristor T has a threshold of −1.5 V, the driving thyristor S turns on when the turn-on signal φI changes from "H" (0 V) to "Lo" (−5 V), and the light-emitting diode LED that is connected in series with the driving thyristor S turns on (emits light).

That is, the transfer thyristor T enters the on-state to specify the light-emitting diode LED that is the target of turn-on control, and the turn-on signal φI at "Lo" (−5 V) turns on the driving thyristor S connected in series with the light-emitting diode LED that is the target of turn-on control and also turns on the light-emitting diode LED.

Note that the turn-on signal φI at "H" (0 V) maintains the driving thyristor S in the off-state and maintains the light-emitting diode LED off. That is, the turn-on signal φI sets on/off of the light-emitting diodes LED.

On/off of the light-emitting diodes LED is controlled by setting the turn-on signal φI in accordance with image data in this way.

Fabrication Method of Light-Emitting Chip C

A fabrication method of the light-emitting chip C will be described. The fabrication method will be described using the cross-sectional view of the island 301 in which the light-emitting diode LED and the driving thyristor S are stacked (FIG. 7).

Figure 12A:
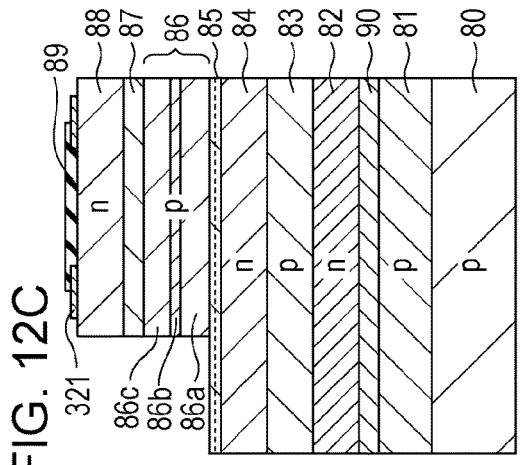
FIGS. 12A to 12F illustrate a fabrication method of the light-emitting chip, specifically.
Figure 12B:
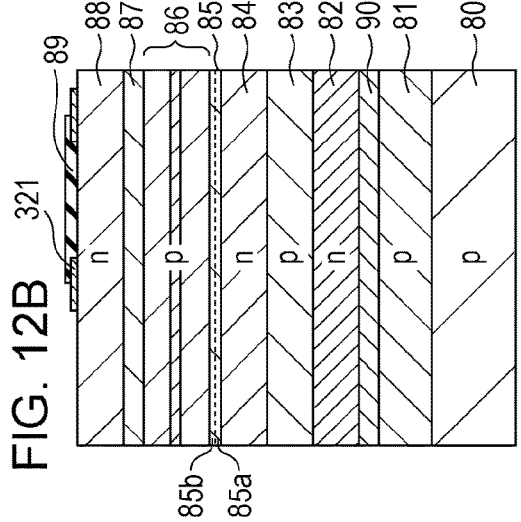
Figure 12C:
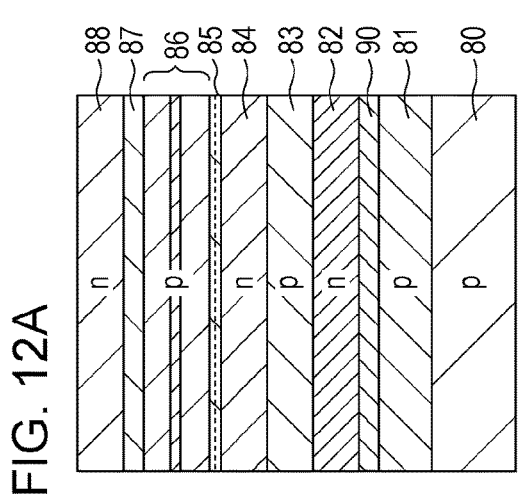
Figure 12D:
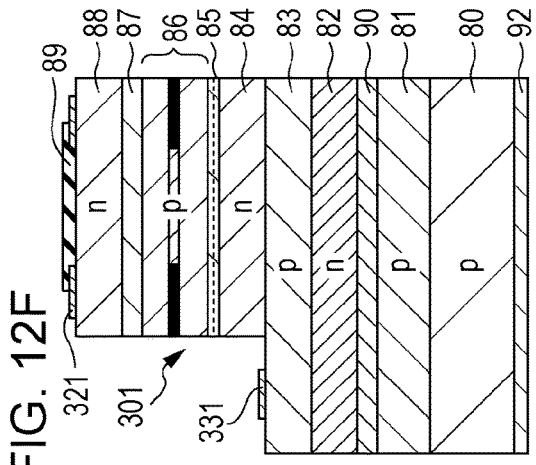
Figure 12E:
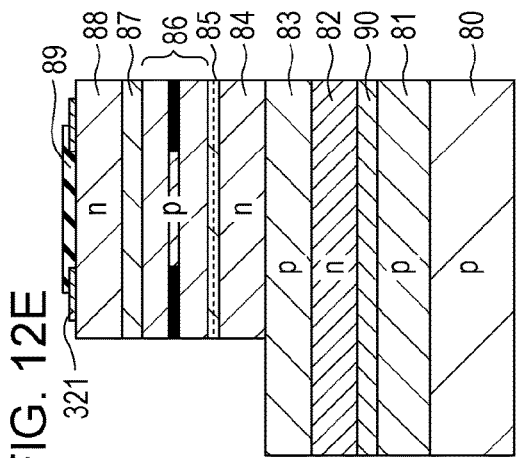
Figure 12F:
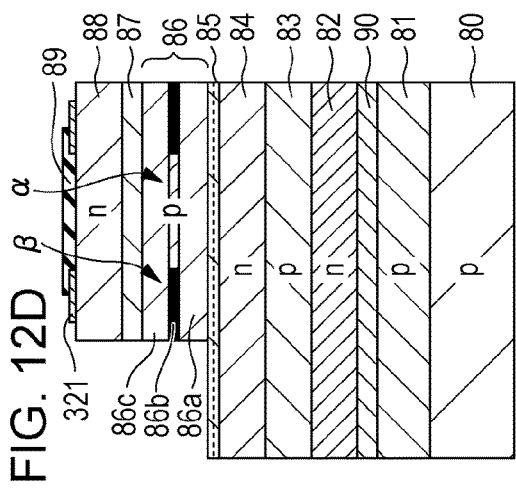

FIGS. 12A to 12F illustrate the fabrication method of the light-emitting chip C. Specifically, FIG. 12A illustrates a step of forming a semiconductor stack, FIG. 12B illustrates a step of forming the n-ohmic electrode 321 and the light exit protection layer 89, FIG. 12C illustrates an etching step for exposing the tunnel junction layer 85, FIG. 12D illustrates a step of forming the current blocking portion β in the current constriction layer 86b, FIG. 12E illustrates an etching step for exposing the p-gate layer 83, and FIG. 12F illustrates a step of forming the p-ohmic electrode 331 and the back-surface electrode 92.

Note that some of FIGS. 12A to 12F collectively illustrate multiple steps.

The steps will be sequentially described.

In the step of forming the semiconductor stack illustrated in FIG. 12A, the p-anode layer 81, the voltage reduction layer 90, the n-gate layer 82, the p-gate layer 83, the n-cathode layer 84, the tunnel junction layer 85, the p-anode layer 86, the light-emitting layer 87, and the n-cathode layer 88 are epitaxially grown on the p-type substrate 80 in this order to form a semiconductor stack.

The description is given using the substrate 80 formed of p-type GaAs, for example; however, the substrate 80 may be formed of n-type GaAs or i-type GaAs. In addition, the substrate 80 may be formed of InP, GaN, InAs, sapphire, Si, etc. When the material of the substrate 80 is changed, a material having a lattice constant that substantially matches that of the substrate (including a strain structure, a strain relaxation layer, and metamorphic growth) is used as a material monolithically stacked on the substrate. For example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a S1 substrate. Note that in the case where a semiconductor material is attached to another supporting substrate after its crystal growth, the semiconductor material need not have a lattice that substantially matches that of the supporting substrate. In addition to the aforementioned supporting substrates, highly heat conductive substrates formed of hexagonal boron nitride (BN), aluminum nitride (AlN), diamond, graphite, or the like may be used.

The p-anode layer 81 is formed of p-type $Al_{0.9}GaAs$ with an impurity concentration of $1 \times 10^{18}$ /cm$^3$, for example. The Al composition ratio may be changed within a range of 0 to 1. Note that GaInP or the like may be alternatively used.

The voltage reduction layer 90 is formed of Ge or of Ge-containing AlGaAs, for example. Note that a material having a small bandgap energy such as a compound of GaAs and InP, a compound of InN and InSb, a compound of InN and InAs, or GaInNAs-based compound semiconductor if the material is a mixture of four or more elements may be alternatively used. Note that the voltage reduction layer 90 may be quantum wires and quantum dots.

The n-gate layer 82 is formed of n-type $Al_{0.9}GaAs$ with an impurity concentration of $1 \times 10^{17}$ /cm$^3$, for example. The Al composition ratio may be changed within a range of 0 to 1. Note that GaInP or the like may be alternatively used.

The p-gate layer 83 is formed of p-type $Al_{0.9}GaAs$ with an impurity concentration of $1 \times 10^{17}$ /cm$^3$, for example. The Al composition ratio may be changed within a range of 0 to 1. Note that GaInP or the like may be alternatively used.

The n-cathode layer 84 is formed of n-type $Al_{0.9}GaAs$ with an impurity concentration of $1\times10^{18}$ /cm$^3$, for example. The Al composition ratio may be changed within a range of 0 to 1. Note that GaInP or the like may be alternatively used.

The tunnel junction layer 85 includes a junction of the n$^{++}$-layer 85a doped with an n-type impurity at a high concentration and the p$^{++}$-layer 85b doped with a p-type impurity at a high concentration (see FIG. 12B). The n$^{++}$-layer 85a and the p$^{++}$-layer 85b have a high impurity concentration of $1\times10^{20}$ /cm$^3$. The impurity concentration of a normal junction is in a range from $10^{17}$ /cm$^3$ to $10^{18}$ /cm$^3$. Examples of the combination of the n$^{++}$-layer 85a and the p$^{++}$-layer 85b (hereinafter, referred to as "n$^{++}$-layer 85a/p$^{++}$-layer 85b) include n$^{++}$GaInP/p$^{++}$GaAs, n$^{++}$GaInP/p$^{++}$AlGaAs, n$^{++}$GaAs/p$^{++}$GaAs, n$^{++}$AlGaAs/p$^{++}$AlGaAs, n$^{++}$InGaAs/p$^{++}$InGaAs, n$^{++}$GaInAsP/p$^{++}$GaInAsP, and n$^{++}$GaAsSb/p$^{++}$GaAsSb. Note that the combinations may be interchanged.

The p-anode layer 86 is constituted by the lower p-layer 86a, the current constriction layer 86b, and the upper p-layer 86c that are sequentially stacked (see FIG. 12C).

The lower p-layer 86a and the upper p-layer 86c are formed of p-type $Al_{0.9}GaAs$ with an impurity concentration of $1\times10^{18}$ /cm$^3$, for example. The Al composition ratio may be changed within a range of 0 to 1. Note that GaInP or the like may be alternatively used.

The current constriction layer 86b is formed of AlAs or p-type AlGaAs with a high composition ratio of Al, for example. Any material may be used as long as Al is oxidized to be $Al_2O_3$ and consequently electrical resistance increases to constrict the current path.

The light-emitting layer 87 has a quantum well structure in which well layers and barrier layers are alternately stacked one on top of the other. The well layers are formed of GaAs, AlGaAs, InGaAs, GaAsP, GaInAs, AlGaInP, GaInAsP, or GaInP, for example. The barrier layers are formed of AlGaAs, GaAs, GaInP, or GaInAsP, for example. Note that the light-emitting layer 87 may have a quantum wire structure or a quantum dot structure.

The n-cathode layer 88 is formed of n-type $Al_{0.9}GaAs$ with an impurity concentration of $1\times10^{18}$ /cm$^3$, for example. The Al composition ratio may be changed within a range of 0 to 1. Note that GaInP or the like may be alternatively used.

These semiconductor layers are stacked using metal organic chemical vapor deposition (MOCVD) or molecular beam epitaxy (MBE), for example. Consequently, the semiconductor stack is formed.

In the step of forming the n-ohmic electrode 321 and the light exit protection layer 89 illustrated in FIG. 12B, the n-ohmic electrode 321 is formed on the n-cathode layer 88 first.

The n-ohmic electrode 321 is formed of Ge-containing Au (AuGe) that easily forms an ohmic contact with an n-type semiconductor layer such as the n-cathode layer 88, for example.

The n-ohmic electrode 321 is formed using the lift-off method, for example.

Then, the light exit protection layer 89 is formed of a material that transmits exiting light, above a light exit surrounded by the n-ohmic electrode 321.

The light exit protection layer 89 is formed of SiC2, SiON, or SiN, for example.

The light exit protection layer 89 is formed using the lift-off method, for example.

In the etching step for exposing the tunnel junction layer 85 illustrated in FIG. 12C, the n-cathode layer 88, the light-emitting layer 87, and the p-anode layer 86 located above the tunnel junction layer 85 at the circumferential portion of the light-emitting diode LED are removed by etching.

This etching may be wet etching using, for example, a sulfuric-acid-based etching solution (sulfuric acid:hydrogen peroxide water:water=1:10:300 in weight ratio) or anisotropic dry etching (RIE) using, for example, boron chloride.

In the step of forming the current blocking portion β of the current constriction layer 86b illustrated in FIG. 12D, the current constriction layer 86b whose side faces have been exposed by the etching step for exposing the tunnel junction layer 85 is oxidized from the side faces to form the current blocking portion β that blocks current. The remaining non-oxidized portion serves as the current passing portion α.

The current constriction layer 86b is oxidized from the side faces in the following manner. For example, Al in the current constriction layer 86b formed of AlAs, AlGaAs, or the like is oxidized through steam oxidation at 300 to 400° C., for example. At that time, oxidation progresses from the exposed side faces, and consequently the current blocking portion β formed of $Al_2O_3$, which is an oxide of Al, is formed at the circumferential portion of the light-emitting diode LED.

Note that the current blocking portion β may be formed by implanting the oxygen ion (O$^+$) (ion implantation) instead of oxidation. That is, the current blocking portion β may be formed by implanting O$^+$ to a portion that serves as the current blocking portion β after the formation of the upper p-layer 86c following the formation of the current constriction layer 86b.

In addition, instead of providing the current constriction layer 86b, the tunnel junction layer 85 may be etched so that the tunnel junction layer 85 is left at a portion corresponding to the current passing portion α and then the p-anode layer 86, the light-emitting layer 87, and the n-cathode layer 88 may be grown. Since a junction of the n-cathode layer 84 and the p-anode layer 86 without the tunnel junction layer 85 interposed therebetween is reverse-biased, current does not easily flow though the junction. That is, the tunnel junction layer 85 provided at the portion corresponding to the current passing portion α serves as the current constriction layer.

In the etching step for exposing the p-gate layer 83 illustrated in FIG. 12E, the tunnel junction layer 85 and the n-cathode layer 84 are etched to expose the p-gate layer 83.

This etching may be wet etching using, for example, a sulfuric-acid-based etching solution (sulfuric acid:hydrogen peroxide water:water=1:10:300 in weight ratio) or anisotropic dry etching (RIE) using, for example, boron chloride.

Note that if the p-gate layer 83 is exposed instead of the tunnel junction layer 85 in the etching step for exposing the tunnel junction layer 85 illustrated in FIG. 12C, Al contained in the p-gate layer 83 may be oxidized in the step of forming the current blocking portion β illustrated in FIG. 12D. If Al contained in the p-gate layer 83 is oxidized, the surface becomes rough or adhesion of the p-ohmic electrode 331 (described later) becomes weak. Accordingly, the step of forming the current blocking portion β is performed in a state in which the tunnel junction layer 85 is exposed.

In the step of forming the p-ohmic electrode 331 and the back-surface electrode 92 illustrated in FIG. 12F, the p-ohmic electrode 331 is formed on the p-gate layer 83 first.

The p-ohmic electrode 331 is formed of Zn-containing Au (AuZn) that easily forms an ohmic contact with a p-type semiconductor layer such as the p-gate layer 83, for example.

The p-ohmic electrode 331 may be formed using the lift off method, for example. At that time, other p-ohmic electrodes may be simultaneously formed.

Then, the back-surface electrode 92 is formed on the back surface of the substrate 80.

The back-surface electrode 92 is formed of AuZn, for example, just like the p-ohmic electrode 331.

In addition to the above steps, the fabrication method include steps, such as a step of forming the protection layer 91, a step of forming through holes in the protection layer 91, and a step of forming the turn-on signal line 75.

The fabrication method of the light-emitting chip C has been described above using the island 301 in which the driving thyristor S and the light-emitting diode LED are stacked.

The islands 302 to 306 including the transfer thyristor T, the coupling diode D, the power supply resistor Rg, and the current-limiting resistors R1 and R2 are formed by adding a step of exposing the surface of the n-cathode layer 84 and a step of forming the n-ohmic electrodes 323, 324, and 325 to the steps described above.

The p-ohmic electrode 331 is disposed on the p-gate layer 83 and is used as the gate terminal Gs of the driving thyristor S above; however, the gate terminal of the driving thyristor S may be disposed on the n-gate layer 82.

As described above, the driving thyristor S and the light-emitting diode LED are stacked in each of the light-emitting chips C according to the first exemplary embodiment. Such a configuration makes the light-emitting chips C be of self-scanning type that sequentially turns on the light-emitting diodes LED by using the transfer thyristors T and the driving thyristors S. As a result, the number of terminals provided in the light-emitting chips C is reduced, and the light-emitting chips C and the light-emitting device 65 become more compact.

The driving thyristors S are sometimes used as light-emitting elements without disposing the light-emitting diodes LED above the respective driving thyristors S. That is, light emitted at a junction of the n-gate layer 82 and the p-gate layer 83 of the on-state driving thyristors S is sometimes used. In this case, transfer characteristics and light emission characteristics are not separately (independently) settable. Thus, it is difficult to increase the driving speed, increase the output power of light, increase the efficiency, reduce the power consumption, and reduce the cost.

For example, suppose that 780-nm light is emitted by using a thyristor (the driving thyristor S) as a light-emitting element. In this case, when a quantum well structure is formed using AlGaAs, the Al composition ratio is set to 30%. In this case, if etching is performed to expose the gate, Al is oxidized, making it impossible to form the gate terminal.

In contrast, in the first exemplary embodiment, the light-emitting diodes LED perform light emission and the transfer thyristors T and the driving thyristors S perform transfer. That is, light emission and transfer are separated from each other. In other words, the driving thyristors S need not emit light. Thus, light emission characteristics are successfully improved by configuring the light-emitting diodes LED to have the quantum well structure, and transfer characteristics of the transfer thyristors T and the driving thyristors S are also successfully improved. That is, the light-emitting diodes LED of the light-emitting unit 102 and the transfer thyristors T and the driving thyristors S of the transfer unit 101 are separately (independently) settable. This makes it easier to achieve a higher driving speed, a higher output power of light, a higher efficiency, a lower power consumption, and a lower cost.

In addition, in the first exemplary embodiment, the light-emitting diode LED and the driving thyristor S are stacked with the tunnel junction layer 85 interposed therebetween. In this case, the tunnel junction layer 85 of the light-emitting diode LED is reverse-biased. A tunnel junction has a characteristic that current flows therethrough even in the reverse-biased state.

If the tunnel junction layer 85 is not provided, a junction of the light-emitting diode LED and the driving thyristor S is reverse-biased. Thus, a voltage that causes breakdown of the reverse-biased junction is applied in order to allow current to flow through the driving thyristor S and the light-emitting diode LED. That is, the driving voltage increases.

However, the driving voltage is reduced by stacking the light-emitting diode LED and the driving thyristor S with the tunnel junction layer 85 interposed therebetween, compared with the case where the light-emitting diode LED and the driving thyristor S are stacked without the tunnel junction layer 85 interposed therebetween.

In addition, the current constriction layer 86b provided in the p-anode layer 86 of the light-emitting diode LED may be provided in the n-cathode layer 88 of the light-emitting diode LED or in the p-anode layer 81 or the n-cathode layer 84 of the driving thyristor S.

Figure 13A:
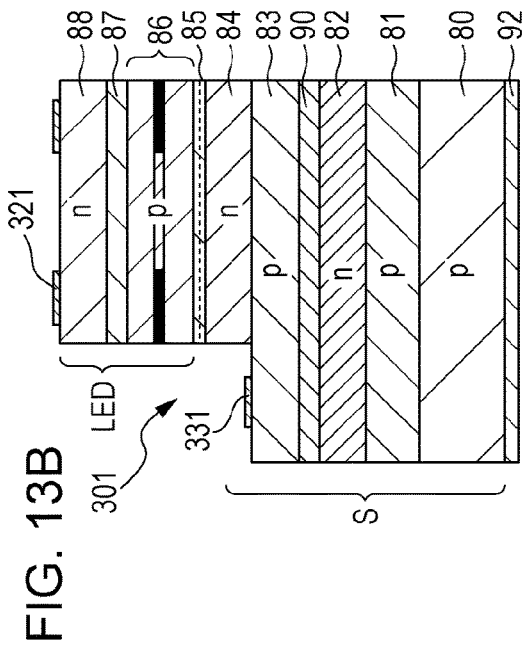
FIGS. 13A to 13D are enlarged cross-sectional views of an island in which a driving thyristor and a light-emitting diode are stacked in accordance with modifications, specifically.
Figure 13B:
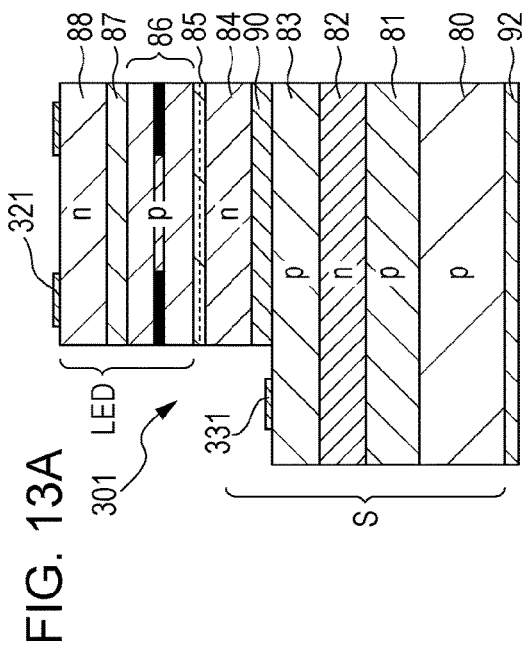
Figure 13C:
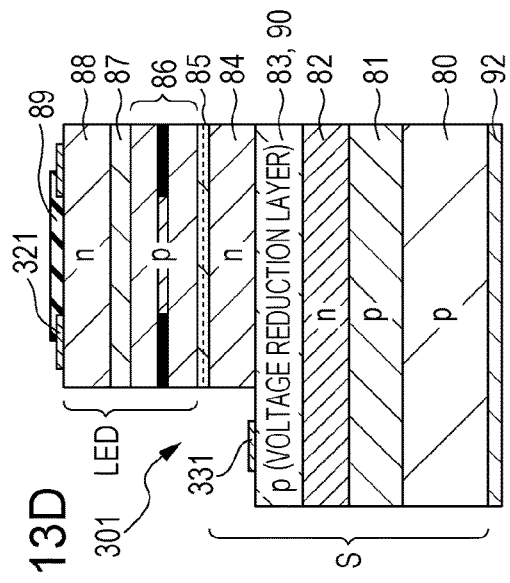
Figure 13D:
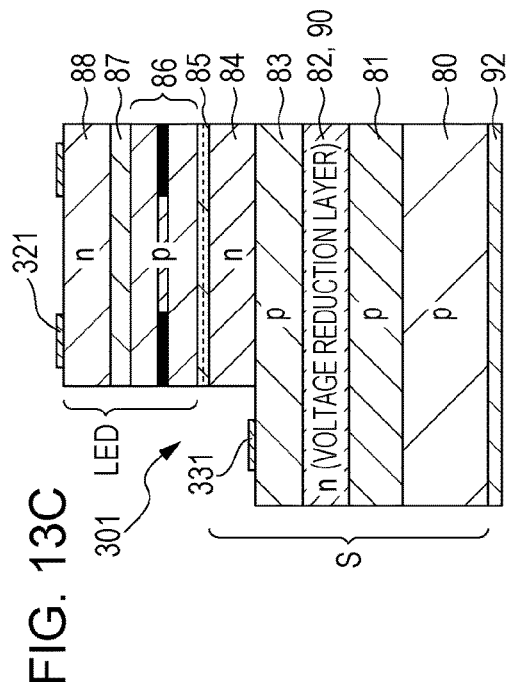

FIGS. 13A to 13D are enlarged cross-sectional views of the island 301 in which the driving thyristor S and the light-emitting diode LED are stacked in accordance with modifications. Specifically, FIG. 13A illustrates the case where the voltage reduction layer 90 is disposed between the p-gate layer 83 and the n-cathode layer 84 of the driving thyristor S. FIG. 13B illustrates the case where the voltage reduction layer 90 is disposed between the n-gate layer 82 and the p-gate layer 83 of the driving thyristor S. FIG. 13C illustrates the case where the n-gate layer 82 serves as the voltage reduction layer 90. FIG. 13D illustrates the case where the p-gate layer 83 serves as the voltage reduction layer 90.

When the voltage reduction layer 90 is disposed between the p-gate layer 83 and the n-cathode layer 84 of the driving thyristor S as illustrated in FIG. 13A, the voltage reduction layer 90 may be a p-layer having an impurity concentration similar to that of the p-gate layer 83 as part of the p-gate layer 83, or may be an n-layer having an impurity concentration similar to that of the n-cathode layer 84 as part of the n-cathode layer 84.

When the voltage reduction layer 90 is disposed between the n-gate layer 82 and the p-gate layer 83 of the driving thyristor S as illustrated in FIG. 13B, the voltage reduction layer 90 may be an n-layer having an impurity concentration similar to that of the n-gate layer 82 as part of the n-gate layer 82 or may be a p-layer having an impurity concentration similar to that of the p-gate layer 83 as part of the p-gate layer 83.

When the n-gate layer 82 serves as the voltage reduction layer 90 as illustrated in FIG. 13C, the voltage reduction layer 90 may be an n-layer having an impurity concentration of the n-gate layer 82.

When the p-gate layer 83 serves as the voltage reduction layer 90 as illustrated in FIG. 13D, the voltage reduction layer 90 may be a p-layer having an impurity concentration of the p-gate layer 83.

Note that the voltage reduction layer 90 may be disposed between the p-anode layer 81, the n-gate layer 82, the p-gate layer 83, and the n-cathode layer 84.

In addition, an example in which a single voltage reduction layer 90 is provided is described in the first exemplary embodiment; however, plural voltage reduction layers 90 may be provided. For example, the voltage reduction layer 90 may be disposed between the p-anode layer 81 and the n-gate layer 82 and between the p-gate layer 83 and the n-cathode layer 84. Alternatively, the voltage reduction layer 90 may be disposed in the n-gate layer 82 and in the p-gate layer 83. In addition, two or three layers may be selected from among the p-anode layer 81, the n-gate layer 82, the p-gate layer 83, and the n-cathode layer 84, and the voltage reduction layer may be disposed in each of the two or three selected layers. The conductivity types of these voltage reduction layers may be set to match the conductivity types of the anode layer, the cathode layer, and the gate layer where the respective voltage reduction layers are disposed or may be i-type. The same applies to other exemplary embodiment.

When the voltage reduction layer 90 is disposed at a position apart from the interface of the n-gate layer 82 and the p-gate layer 83 that forms reverse bias as in the configuration illustrated in FIG. 13A and in the light-emitting chip C according to the first exemplary embodiment illustrated in FIG. 7, the influence of the voltage reduction layer 90 on the switching voltage Vs illustrated in FIG. 8C decreases compared with the configurations illustrated in FIGS. 13B to 13D, and an erroneous operation of the thyristor (erroneous turn-on) is suppressed in a state in which the on-voltage is not applied to the p-ohmic electrode 331 that is the gate Gs of the driving thyristor S.

On the other hand, in the configurations illustrated in FIGS. 13B to 13D, the voltage reduction layer 90 directly influences the reverse bias caused between the n-gate layer 82 and the p-gate layer 83. Consequently, the switching voltage Vs reduces and the thyristor is more likely to erroneously turn on in the state in which the on-voltage is not applied to the p-ohmic electrode 331, than in the configuration illustrated in FIG. 13A.

In addition, in the configuration illustrated in FIG. 13A, the presence of the voltage reduction layer 90 having a smaller bandgap than the p-gate layer 83 and the n-cathode layer 84 between the p-gate layer 83 and the n-cathode layer 84 makes the thyristor easily turn on with a small voltage difference between the p-ohmic electrode 331 serving as the gate Gs of the driving thyristor S and the n-ohmic electrode 321 compared with the configuration without the voltage reduction layer 90 between the p-gate layer 83 and the n-cathode layer 84. That is, in the configuration illustrated in FIG. 13A, not only an erroneous operation in which the thyristor erroneously turns on due to voltage applied across the n-ohmic electrode 321 and the back-surface electrode 92 in the state in which the on-voltage is not applied to the p-ohmic electrode 331 is suppressed but also the thyristor easily turns on with a small voltage difference between the p-ohmic electrode 331 and the n-ohmic electrode 321, compared with the configurations illustrated in FIGS. 13B to 13D.

Note that in the configuration in which the voltage reduction layer 90 is located between the n-gate layer 82 and the p-anode layer 81 as in FIG. 7, by providing a gate electrode on the n-gate layer 82 in place of the p-ohmic electrode 331, the thyristor easily turns on even if the voltage difference between this gate electrode and the back-surface electrode 92 is small. In addition, in the configurations illustrated in FIGS. 13A and 7, the polarity may be reversed by using an n-type substrate.

Second Exemplary Embodiment

A light-emitting chip C according to a second exemplary embodiment uses laser diodes, which are an example of light-emitting elements, in place of the light-emitting diodes LED used in the first exemplary embodiment.

The configuration other than the light-emitting chip C is substantially the same as that of the first exemplary embodiment. Thus, the light-emitting chip C will be described, and a description of the substantially the same part is omitted.

Figure 14:
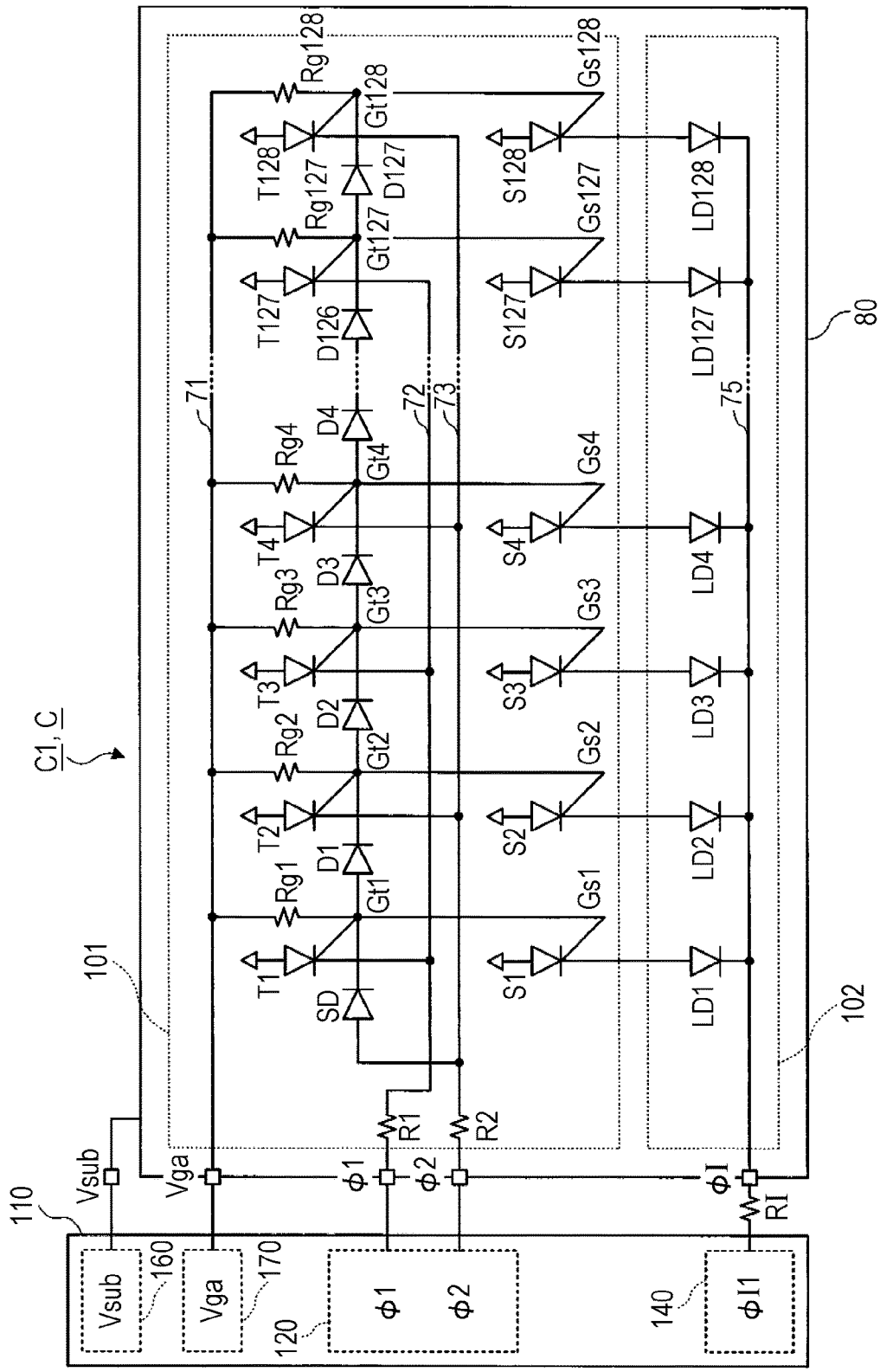
FIG. 14 is an equivalent circuit diagram illustrating a circuit configuration of a light-emitting chip in which an SLED array according to a second exemplary embodiment is mounted.

FIG. 14 is an equivalent circuit diagram illustrating a circuit configuration of the light-emitting chip C in which an SLED array according to the second exemplary embodiment is mounted. The light-emitting diodes LED1 to LED128 illustrated in FIG. 5 in the first exemplary embodiment are replaced with laser diodes LD1 to LD128. The laser diodes LD1 to LD128 are referred to as laser diodes LD when they are not distinguished from one another. Since the rest of the configuration is substantially the same as that illustrated in FIG. 5, a description thereof is omitted.

In addition, as for the plan layout view and the cross-sectional view of the light-emitting chip C according to the second exemplary embodiment, the light-emitting diodes LED illustrated in FIGS. 6A and 6B in the first exemplary embodiment just need to be replaced with the laser diodes LD. Thus, the plan layout view and the cross-sectional view of the light-emitting chip C according to the second exemplary embodiment are omitted.

In the light-emitting chip C according to the second exemplary embodiment, the driving thyristor S and the laser diode LD are stacked.

The laser diode LD includes the light-emitting layer 87 sandwiched by two cladding layers (hereinafter, referred to as cladding layers). The cladding layers are layers having a greater refractive index than the light-emitting layer 87. Light emitted from the light-emitting layer 87 is reflected by interfaces between the light-emitting layer 87 and the cladding layers to confine the light in the light-emitting layer 87. Then, the confined light is resonated by a resonator constituted by side faces of the light-emitting layer 87 to cause laser oscillation. The light-emitting layer 87 is sometimes referred to as an active layer.

Figure 15:
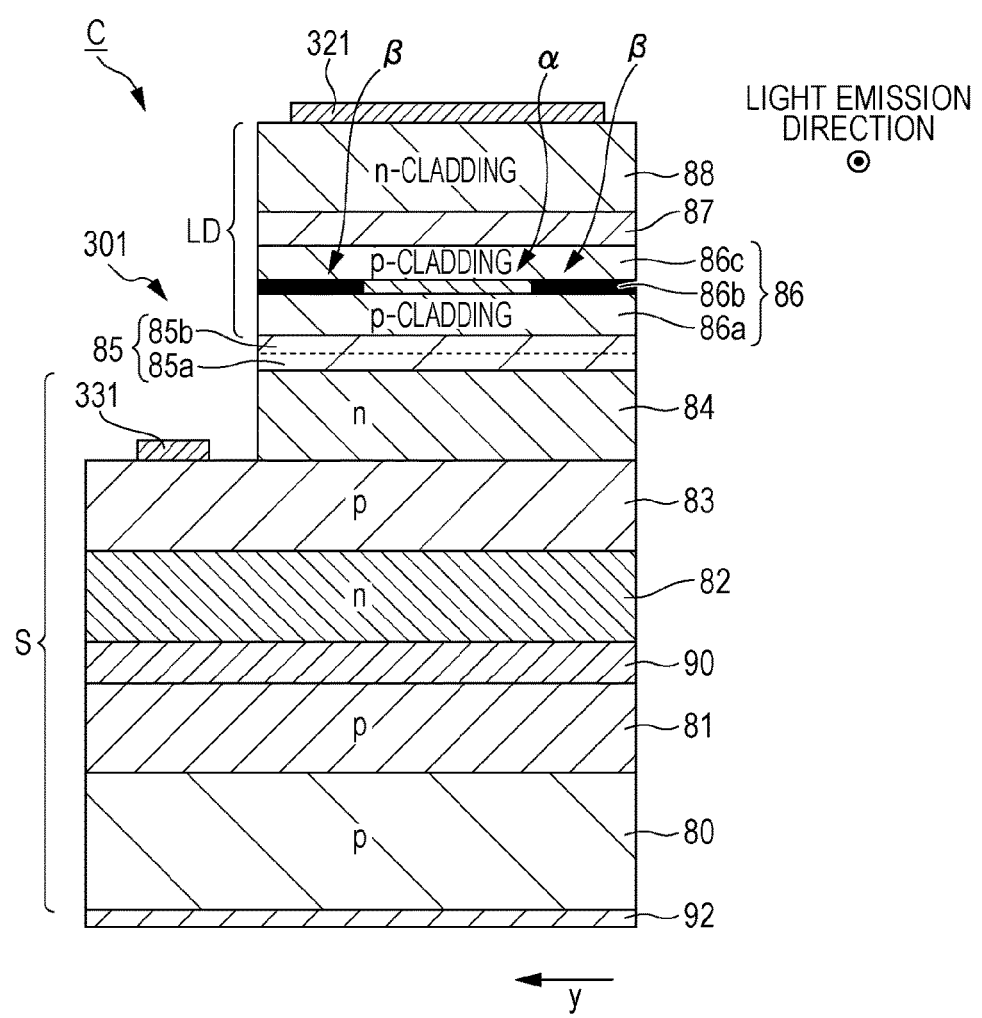
FIG. 15 is an enlarged cross-sectional view of an island in which a driving thyristor and a laser diode are stacked in the light-emitting chip according to the second exemplary embodiment.

FIG. 15 is an enlarged cross-sectional view of the island 301 in which the driving thyristor S and the laser diode LD are stacked in the light-emitting chip C according to the second exemplary embodiment.

In the light-emitting chip C, the p-anode layer 86 is constituted by p-cladding layers and the current constriction layer 86*b*. Specifically, the lower p-layer 86*a* and the upper p-layer 86*c* of the p-anode layer 86 are formed as cladding layers. In addition, the n-cathode layer 88 is formed as a cladding layer. Note that the lower p-layer 86*a*, the upper p-layer 86*c*, and the n-cathode layer 88 are sometimes referred to as a lower p-cladding layer 86*a*, an upper p-cladding layer 86*c*, and an n-cathode (n-cladding) layer 88, respectively. In addition, the entire p-anode layer 86 is sometimes referred to as a p-anode (p-cladding) layer 86. The terms "p-CLADDING" and "n-CLADDING" are used in the drawings.

The lower p-cladding layer 86*a* and the upper p-cladding layer 86*c* of the p-anode (p-cladding) layer 86 are formed of p-type $Al_{0.9}GaAs$ with an impurity concentration of $5 \times 10^{17}/cm^3$, for example. The Al composition ratio may be changed within a range of 0 to 1. Note that GaInP or the like may be alternatively used.

The n-cathode (n-cladding) layer 88 is formed of n-type $Al_{0.9}GaAs$ with an impurity concentration of $5 \times 10^{17}$ /cm$^3$, for example. The Al composition ratio may be changed within a range of 0 to 1. Note that GaInP or the like may be used instead of $Al_{0.9}GaAs$.

The p-anode (p-cladding) layer 86, the n-cathode (n-cladding) layer 88, and the light-emitting layer 87 are configured so that light emitted from the light-emitting layer 87 is confined between the p-anode (p-cladding) layer 86 and the n-cathode (n-cladding) layer 88 and laser oscillation is caused between the side faces (end faces) of the light-emitting layer 87. In this case, the light is emitted from the side faces (end faces) of the light-emitting layer 87.

Thus, the n-ohmic electrode 321 is disposed on substantially the entire surface of the n-cathode (n-cladding) layer 88.

Note that the direction in which the light is emitted in FIG. 15 is a direction perpendicular to the y direction, that is, the −x direction illustrated in FIG. 6A for convenience of explanation. Thus, the light may be emitted in the −y direction. In addition, the light may be directed in a direction perpendicular to the substrate 80 using a mirror or the like. The same applies to the other light-emitting chips C and modifications thereof.

Since electric power consumed by non-radiative recombination is reduced by providing the current constriction layer 86b, power consumption reduces and light extraction efficiency improves.

The light-emitting chip C according to the second exemplary embodiment is fabricated by partially modifying the fabrication method according to the first exemplary embodiment illustrated in FIGS. 12A to 12F. Specifically, in the step of forming the semiconductor stack illustrated in FIG. 12A, the lower p-layer 86a and the upper p-layer 86c of the p-anode layer 86 are formed as cladding layers. Likewise, the n-cathode layer 88 is formed as a cladding layer.

The light-emitting chip C according to the second exemplary embodiment operates in accordance with the timing chart illustrated in FIG. 11 just like the light-emitting chip C according to the first exemplary embodiment.

Note that the current constriction layer 86b provided in the p-anode (p-cladding) layer 86 of the laser diode LD may be provided in the n-cathode (n-cladding) layer 88 of the laser diode LD or in the p-anode layer 81 or the n-cathode layer 84 of the driving thyristor S.

Third Exemplary Embodiment

An light-emitting chip C according to a third exemplary embodiment uses vertical-cavity surface-emitting lasers (VCSEL), each of which is an example of a light-emitting element, in place of the light-emitting diodes LED according to the first exemplary embodiment and the laser diodes LD according to the second exemplary embodiment.

The configuration other than the light-emitting chip C is substantially the same as that of the first exemplary embodiment. Thus, the light-emitting chip C will be described, and a description of the substantially the same part is omitted.

Figure 16:
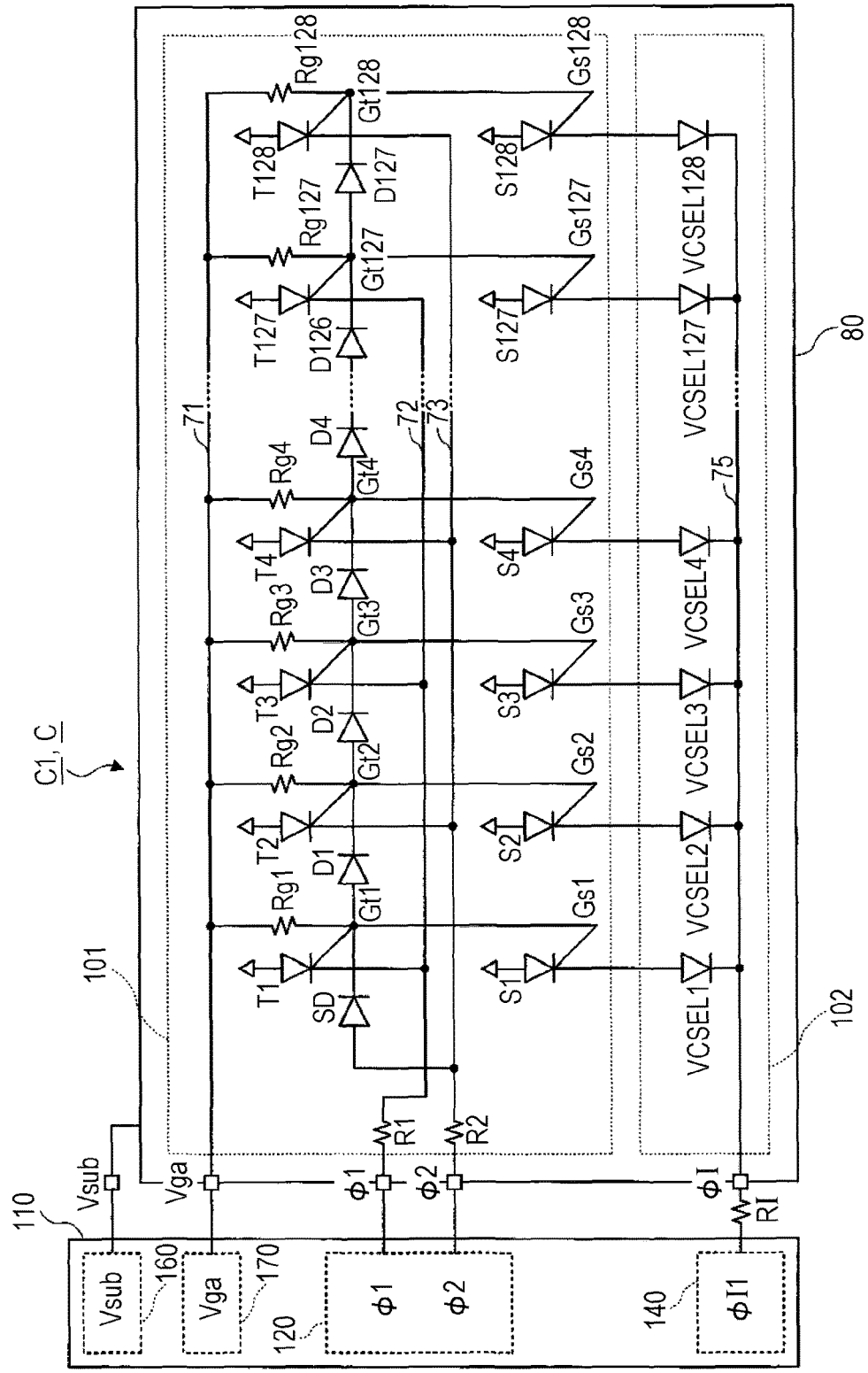
FIG. 16 is an equivalent circuit diagram illustrating a circuit configuration of a light-emitting chip in which an SLED array according to a third exemplary embodiment is mounted.

FIG. 16 is an equivalent circuit diagram illustrating a circuit configuration of the light-emitting chip C in which an SLED array according to the third exemplary embodiment is mounted. In FIG. 16, the light-emitting diodes LED1 to LED128 illustrated in FIG. 5 in the first exemplary embodiment are replaced with the vertical-cavity surface-emitting lasers VCSEL1 to VCSEL128. The vertical-cavity surface-emitting lasers VCSEL1 to VCSEL128 are referred to as vertical-cavity surface-emitting lasers VCSEL when they are not distinguished from one another. Since the rest of the configuration is substantially the same as that illustrated in FIG. 5, a description thereof is omitted.

In addition, as for the plan layout view and the cross-sectional view of the light-emitting chip C according to the third exemplary embodiment, the light-emitting diodes LED illustrated in FIGS. 6A and 6B in the first exemplary embodiment are replaced with the vertical-cavity surface-emitting lasers VCSEL. Thus, the plan layout view and the cross-sectional view of the light-emitting chip C according to the third exemplary embodiment are omitted.

Figure 17:
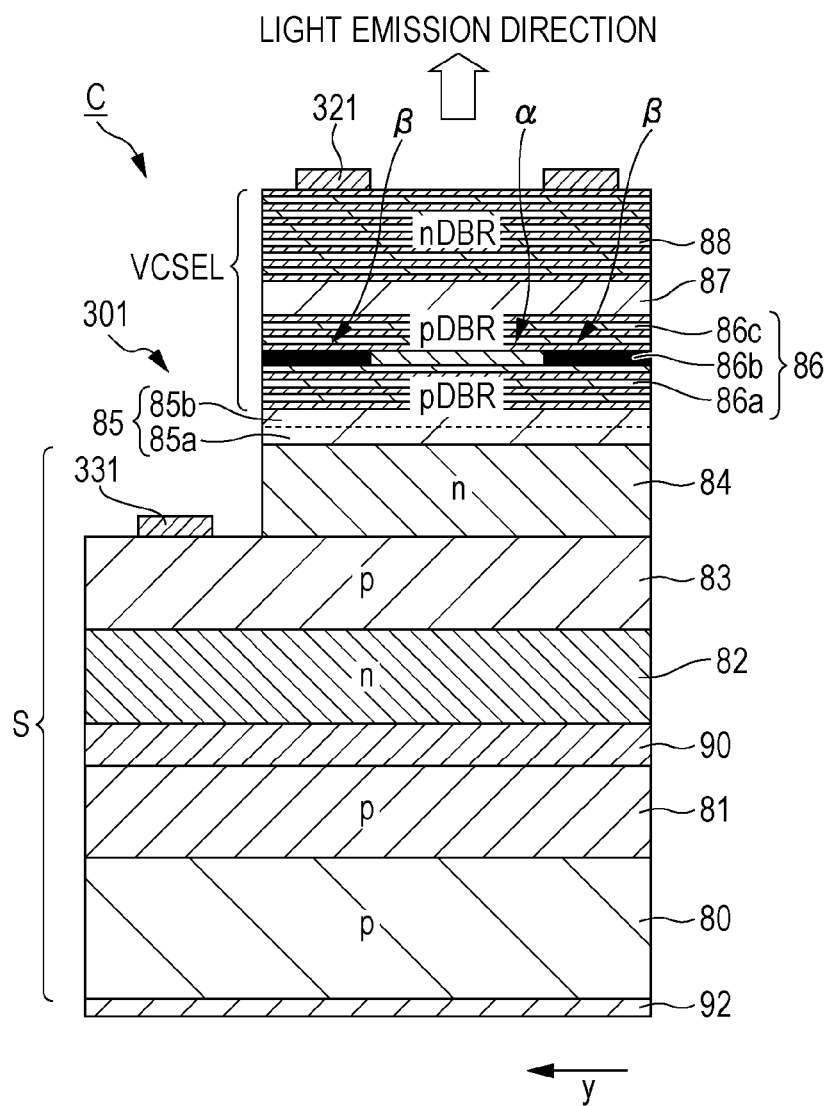
FIG. 17 is an enlarged cross-sectional view of an island in which a driving thyristor and a vertical-cavity surface-emitting laser are stacked in the light-emitting chip according to the third exemplary embodiment.

FIG. 17 is an enlarged cross-sectional view of the island 301 in which the driving thyristor S and the vertical-cavity surface-emitting laser VCSEL are stacked in the light-emitting chip C according to the third exemplary embodiment.

The driving thyristor S and the vertical-cavity surface-emitting laser VCSEL are stacked.

In the light-emitting chip C according to the third exemplary embodiment, the p-anode layer 86 and the n-cathode layer 88 are formed as distribute Bragg reflector (DBR) layers (hereinafter, referred to as DBR layers). The p-anode layer 86 includes the current constriction layer 86b. That is, the p-anode layer 86 is constituted by the lower p-layer 86a, the current constriction layer 86b, and the upper p-layer 86c that are sequentially stacked, and the lower p-layer 86a and the upper p-layer 86c are formed as DBR layers.

Note that the lower p-layer 86a, the upper p-layer 86c, and the n-cathode layer 88 are sometimes referred to as a lower p(DBR)-layer 86a, an upper p(DBR)-layer 86c, and an n-cathode (DBR) layer 88, respectively.

A DBR layer is constituted by a combination of low refractive index layers with a high Al composition ratio, for example, $Al_{0.9}Ga_{0.1}As$ and high refractive index layers with a low Al composition ratio, for example, $Al_{0.2}Ga_{0.8}As$. Thicknesses (optical path length) of the low refractive index layers and the high refractive index layers are set to 0.25 (¼) of the center wavelength, for example. Note that the Al composition ratios of the low refractive index layers and the high refractive index layers may be changed within a range of 0 to 1.

Note that the thickness (optical path length) of the current constriction layer 86b is determined by the adopted structure. In the case where importance is placed on extraction efficiency and process reproducibility, the thickness (optical path length) of the current constriction layer 86b is desirably set to an integer multiple of the thickness (optical path length) of the low refractive index layers and the high refractive index layers constituting the DBR layer. The thickness is set to 0.75 (¾) of the center wavelength, for example. In the case of an odd multiple, the current constriction layer 86b is desirably sandwiched by a high refractive index layer and a high refractive index layer. In the case of an even multiple, the current constriction layer 86b is desirably sandwiched by a high refractive index layer and a low refractive index layer. That is, the current constriction layer 86b is desirably provided to suppress a disturbance in the period of the refractive index due to the DBR layer. Conversely, in the case where a reduction of the influences of an oxidized portion (in the refractive index and distortion) is desired, the thickness of the current constriction layer 86b is desirably set to several tens of nanometers (nm) and is desirably inserted at a portion corresponding to a node of a standing wave caused in the DBR layer.

Note that a DBR layer may be a dielectric multilayer reflecting mirror formed of a combination of $Si_xN_y$, $SiO_2$, $Ti_xO_y$, etc. Alternatively, a DBR layer may be a high-contrast grating. In addition, part of a semiconductor layer, such as part of the p-anode layer 86 or the n-cathode layer 88, may be formed as a DBR layer. The same applies to the other exemplary embodiments.

The vertical-cavity surface-emitting laser VCSEL resonates light at the light-emitting layer 87 sandwiched by two DBR layers (the p-anode (DBR) layer 86 and the n-cathode (DBR) layer 88) to cause laser oscillation. Laser oscillation occurs when the reflectance between the light-emitting layer 87 and the two DBR layers (the p-anode (p-DBR) layer and the n-cathode (n-DBR) layer 88) becomes greater than or equal to 99%, for example.

Since the vertical-cavity surface-emitting laser VCSEL includes the p-anode (DBR) layer 86 located between the tunnel junction layer 85 and the light-emitting layer 87, light does not reach the tunnel junction layer 85. Thus, the bandgap of the tunnel junction layer 85 may be smaller than the bandgap equivalent to the oscillation wavelength. That is, resistance is successfully reduced.

The light-emitting chip C according to the third exemplary embodiment operates in accordance with the timing chart illustrated in FIG. 11 just light the light-emitting chip C according to the first exemplary embodiment.

The current constriction layer 86b provided in the p-anode (p-DBR) layer 86 of the vertical-cavity surface-emitting laser VCSEL may be provided in the n-cathode (n-DBR) layer 88 of the vertical-cavity surface-emitting laser VCSEL or in the p-anode layer 81 or the n-cathode layer 84 of the driving thyristor S. In this case, a certain amount of light passes through the tunnel junction layer 85. Thus, a material having a bandgap greater than the bandgap equivalent to the oscillation wavelength may be used for the tunnel junction layer 85, the thickness of the tunnel junction layer 85 may be reduced, or the tunnel junction layer may be located at a portion corresponding to a node of a standing wave in order to reduce an amount of light absorbed by the tunnel junction layer 85. In addition, since the voltage reduction layer 90 also absorbs light, the thickness of the voltage reduction layer 90 may be reduced or the voltage reduction layer 90 may be located at a node of a standing wave when a structure in which a certain amount of light passes through is used.

In the first to third exemplary embodiments described above, the light-emitting element (the light-emitting diode LED, the laser diode LD, or the vertical-cavity surface-emitting laser VCSEL) and the driving thyristor S are stacked with the tunnel junction layer 85 interposed therebetween so that the light-emitting element and the driving thyristor S are connected in series. Alternatively, the light-emitting element (the light-emitting diode LED, the laser diode LD, or the vertical-cavity surface-emitting laser VCSEL) and the driving thyristor S may be connected in series by a wire instead of the tunnel junction layer 85. In addition, a material that is epitaxially grown and suppresses the pn junction from being reverse-biased may be used between the light-emitting element (the light-emitting diode LED, the laser diode LD, or the vertical-cavity surface-emitting laser VCSEL) and the driving thyristor S.

The above description has been given mainly of the case where the substrate 80 is formed of p-type GaAs by way of example in the first to third exemplary embodiments. An example of semiconductor layers (a semiconductor stack formed in the step of forming the semiconductor stack illustrated in FIG. 12A) formed when a substrate of another type is used will be described.

First, an example of the semiconductor stack in the case where a GaN substrate is used is as described below.

The p-anode layer 81 is formed of p-type $Al_{0.9}GaN$ with an impurity concentration of $1\times10^{18}$ /cm$^3$, for example. The Al composition ratio may be changed within a range of 0 to 1.

The voltage reduction layer 90 is formed of InN quantum dots, for example.

The n-gate layer 82 is formed of n-type $Al_{0.9}GaN$ with an impurity concentration of $1\times10^{17}$ /cm$^3$, for example. The Al composition ratio may be changed within a range of 0 to 1.

The p-gate layer 83 is formed of p-type $Al_{0.9}GaN$ with an impurity concentration of $1\times10^{17}$ /cm$^3$, for example. The Al composition ratio may be changed within a range of 0 to 1.

The n-cathode layer 84 is formed of n-type $Al_{0.9}GaN$ with an impurity concentration of $1\times10^{18}$ /cm$^3$, for example. The Al composition ratio may be changed within a range of 0 to 1.

The tunnel junction layer 85 includes a junction of the $n^{++}$-layer 85a doped with an n-type impurity at a high concentration and the $p^{++}$-layer 85b doped with a p-type impurity at a high concentration (see FIG. 12B). The $n^{++}$-layer 85a and the $p^{++}$-layer 85b have a high impurity concentration of $1\times10^{20}$ /cm$^3$, for example. The impurity concentration of a normal junction is in a range from $10^{17}$/cm$^3$ to $10^{18}$ /cm$^3$. Examples of the combination of the $n^{++}$-layer 85a and the $p^{++}$-layer 85b (hereinafter, referred to as "$n^{++}$-layer 85a/$p^{++}$-layer 85b) include $n^{++}$GaN/$p^{++}$GaN, $n^{++}$GaInN/$p^{++}$GaInN, and $n^{++}$AlGaN/$p^{++}$AlGaN. Note that the combinations may be interchanged.

The p-anode layer 86 is constituted by the lower p-layer 86a, the current constriction layer 86b, and the upper p-layer 86c that are sequentially stacked (see FIG. 12C).

The lower p-layer 86a and the upper p-layer 86c are formed of p-type $Al_{0.9}GaN$ with an impurity concentration of $1\times10^{18}$ /cm$^3$, for example. The Al composition ratio may be changed within a range of 0 to 1.

Since it is difficult to use an oxidized constriction layer as the current constriction layer on a GaN substrate, a tunnel junction, a ridge structure, or a buried structure is desirably used as the current constriction layer. Alternatively, the current constriction layer may be formed by ion implantation.

The light-emitting layer 87 has a quantum well structure in which well layers and barrier layers are alternately stacked. The well layers are formed of GaN, InGaN, or AlGaN, for example, and the barrier layers are formed of AlGaN or GaN, for example. Note that the light-emitting layer 87 may have a quantum wire structure or a quantum dot structure.

The n-cathode layer 88 is formed of n-type $Al_{0.9}GaN$ with an impurity concentration of $1\times10^{18}$ /cm$^3$, for example. The Al composition ratio may be changed within a range of 0 to 1.

An example of the semiconductor stack in the case where an InP substrate is used is as described below.

The p-anode layer 81 is formed of p-type InGaAsP with an impurity concentration of $1\times10^{18}$ /cm$^3$, for example. The Ga composition ratio may be changed within a range of 0 to 1.

The voltage reduction layer 90 is formed of a compound with a small bandgap energy, for example, a compound of GaAs and InP, a compound of InN and InSb, or a compound of InN and InAs. Note that a GaInNAs-based compound semiconductor may be alternatively used if the material is a mixture of four or more elements.

The n-gate layer 82 is formed of n-type InGaAsP with an impurity concentration of $1\times10^{17}$ /cm$^3$, for example. The Ga composition ratio may be changed within a range of 0 to 1.

The p-gate layer 83 is formed of p-type InGaAsP with an impurity concentration of $1\times10^{17}$ /cm$^3$, for example. The Ga composition ratio may be changed within a range of 0 to 1.

The n-cathode layer 84 is formed of n-type InGaAsP with an impurity concentration of $1\times10^{18}$ /cm$^3$, for example. The Ga composition ratio may be changed within a range of 0 to 1.

The tunnel junction layer 85 includes a junction of the n$^{++}$-layer 85a doped with an n-type impurity at a high concentration and the p$^{++}$-layer 85b doped with a p-type impurity at a high concentration (see FIG. 12B). The n$^{++}$-layer 85a and the p$^{++}$-layer 85b have a high impurity concentration of $1\times10^{20}$ /cm$^3$, for example. The impurity concentration of a normal junction is in a range from $10^{17}$/cm$^3$ to $10^{18}$ /cm$^3$. Examples of the combination of the n$^{++}$-layer 85a and the p$^{++}$-layer 85b (hereinafter, referred to as "n$^{++}$-layer 85a/p$^{++}$-layer 85b) include n$^{++}$InP/p$^{++}$InP, n$^{++}$InAsP/p$^{++}$InAsP, n$^{++}$InGaAsP/p$^{++}$InGaAsP, and n$^{++}$InGaAsPSb/p$^{++}$InGaAsPSb. Note that the combinations may be interchanged.

The p-anode layer 86 is constituted by the lower p-layer 86a, the current constriction layer 86b, and the upper p-layer 86c that are sequentially stacked (see FIG. 12C).

The lower p-layer 86a and the upper p-layer 86c are formed of p-type InGaAsP with an impurity concentration of $1\times10^{18}$ /cm$^3$, for example. The Ga composition ratio may be changed within a range of 0 to 1.

Since it is difficult to use an oxidized constriction layer as the current constriction layer on an InP substrate, a tunnel junction, a ridge structure, or a buried structure is desirably used as the current constriction layer. Alternatively, the current constriction layer may be formed by ion implantation.

The light-emitting layer 87 has a quantum well structure in which well layers and barrier layers are alternately stacked. The well layers are formed of InAs, InGaAsP, AlGaInAs, or GaInAsPSb, for example, and the barrier layers are formed of InP, InAsP, InGaAsP, or AlGaInAsP, for example. Note that the light-emitting layer 87 may have a quantum wire structure or a quantum dot structure.

The n-cathode layer 88 is formed of n-type InGaAsP with an impurity concentration of $1\times10^{18}$ /cm$^3$, for example. The Ga composition ratio may be changed within a range of 0 to 1.

These semiconductor layers are stacked using MOCVD or MBE, for example. Consequently, the semiconductor stack is formed.

Fourth Exemplary Embodiment

In the first to third exemplary embodiments, the light-emitting element (the light-emitting diode LED, the laser diode LD, or the vertical-cavity surface-emitting laser VCSEL) and the driving thyristor S are stacked with the tunnel junction layer 85 interposed therebetween so that the light-emitting element and the driving thyristor S are connected in series.

A III-V compound layer having metallic conductivity may be used in place of the tunnel junction layer 85.

Figure 18A:
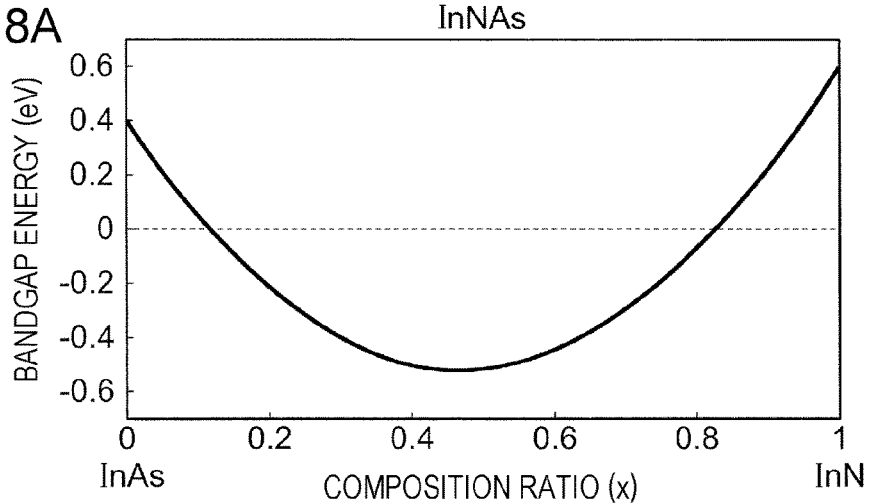
FIGS. 18A to 18C respectively illustrate a bandgap of InNAs relative to the InN composition ratio x, a bandgap of InNSb relative to the InN composition ratio x, and lattice constants of group VI elements and III-V compounds relative to the bandgap.
Figure 18B:
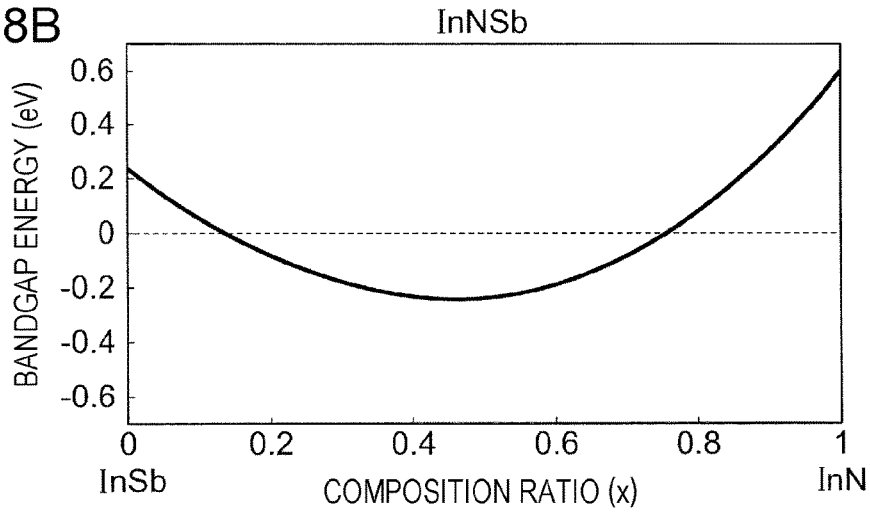
Figure 18C:
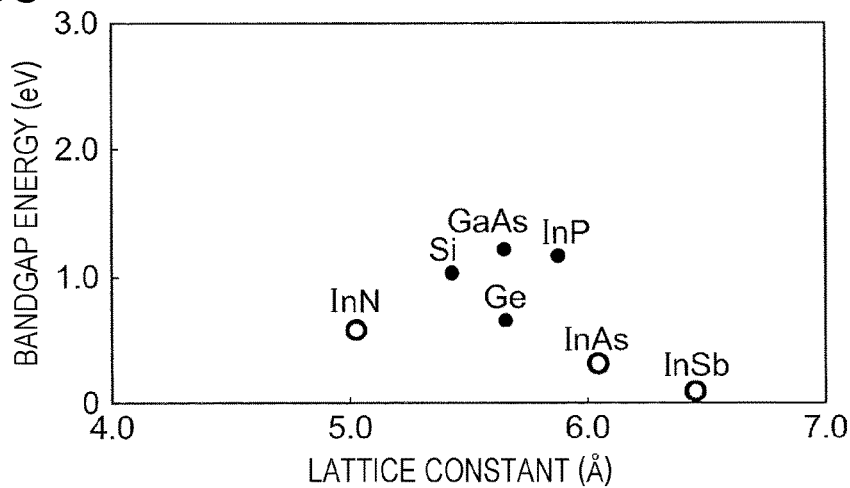

FIGS. 18A to 18C describe materials of the metallic conductive III-V compound layer. Specifically, FIG. 18A illustrates the bandgap of InNAs against the InN composition ratio x, FIG. 18B illustrates the bandgap of InNSb against the InN composition ratio x, and FIG. 18C illustrates lattice constants of group VI elements and III-V compounds against the bandgap.

FIG. 18A illustrates bandgap energy (eV) of InNAs, which is a compound of InN with a composition ratio x (x=0 to 1) and InAs with a composition ratio (1−x).

FIG. 18B illustrates bandgap energy (eV) of InNSb, which is a compound of InN with a composition ratio x (x=0 to 1) and InSb with a composition ratio (1−x).

InNAs and InNSb, which are described as examples of the material of the metallic conductive III-V compound layer, are known to have negative bandgap energy in a certain range of the composition ratio x as illustrated in FIGS. 18A and 18B. The negative bandgap energy indicates that there is no bandgap. Thus, InNAs and InNSb exhibit conductive characteristics (conduction characteristics) similar to those of metals. That is, the metallic conductive characteristics (conduction characteristics) indicate that a current flows when a potential gradient exists, as in metals.

As illustrated in FIG. 18A, InNAs has negative bandgap energy when the InN composition ratio x is in a range of about 0.1 to about 0.8, for example.

As illustrated in FIG. 18B, InNSb has negative bandgap energy when the InN composition ratio x is in a range of about 0.2 to about 0.75, for example.

That is, InNAs and InNSb exhibit metallic conductive characteristics (conduction characteristics) in the above ranges.

Note that since thermal energy allows electrons to have energy enough to cross a small bandgap in small bandgap regions outside the above ranges, current easily flows when the bandgap energy is negative and when a potential gradient exists as in metals.

Even when InNAs or InNSb contains Al, Ga, Ag, P, etc., the bandgap energy is successfully maintained close to 0 or negative depending on the composition. Current flows when a potential gradient exists.

Further, InNAs and InNSb are successfully epitaxially grown on a III-V compound (semiconductor) layer such as a GaAs layer. Moreover, a III-V compound (semiconductor) layer such as a GaAs layer is successfully epitaxially grown on an InNAs layer.

Thus, when the light-emitting element (the light-emitting diode LED, the laser diode LD, or the vertical-cavity surface-emitting laser VCSEL) and the driving thyristor S are stacked with the metallic conductive III-V compound layer interposed therebetween instead of the tunnel junction layer 85 so that the light-emitting element and the driving thyristor S are connected in series, reverse biasing of the n-cathode layer 84 of the driving thyristor S and the p-anode layer 86 of the light-emitting element is suppressed.

When the light-emitting element (the light-emitting diode LED, the laser diode LD, or the vertical-cavity surface-emitting laser VCSEL) and the driving thyristor S are stacked without the tunnel junction layer 85 or the metallic conductive III-V compound layer interposed therebetween, the n-cathode layer 84 of the driving thyristor S and the p-anode layer 86 of the light-emitting element are reverse-biased. Thus, a high voltage that causes breakdown at the reverse-biased junction (junction of the n-cathode layer 84 and the p-anode layer 86) needs to be applied.

However, if the metallic conductive III-V compound layer is used, a high voltage that causes breakdown at the reverse-biased junction (junction of the n-cathode layer 84 and the p-anode layer 86) need not be applied as in the case of using the tunnel junction layer 85.

In addition, the metallic conductive III-V compound layer is applicable to the light-emitting chips C according to the first to third exemplary embodiments. That is, the tunnel junction layer 85 may be replaced with the metallic conductive III-V compound layer. In addition, the same applies to the semiconductor layer used when another type of substrate is used instead of the p-type GaAs substrate described above. Thus, a detailed description is omitted.

Fifth Exemplary Embodiment

A fifth exemplary embodiment uses a photothyristor P. The photothyristor P turns on when being irradiated with light.

Figure 19:
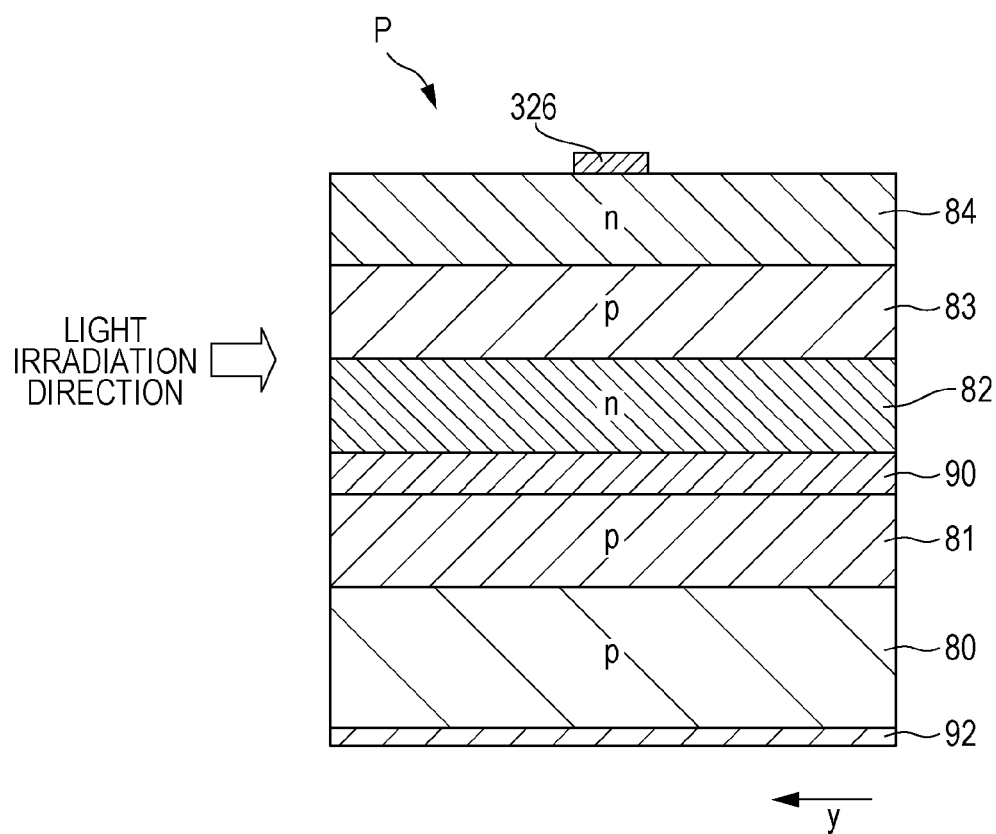
FIG. 19 is an enlarged cross-sectional view of a photothyristor according to a fifth exemplary embodiment.

FIG. 19 is an enlarged cross-sectional view of the photothyristor P according to the fifth exemplary embodiment. Specifically, FIG. 19 illustrates a cross-sectional structure of the photothyristor P.

The photothyristor P is constituted by the p-anode layer 81, the voltage reduction layer 90, the n-gate layer 82, the p-gate layer 83, and the n-cathode layer 84 that are staked on the p-type substrate 80. The back-surface electrode 92 is disposed on the back surface of the substrate 80, and the n-ohmic electrode 326 is disposed on the n-cathode layer 84.

The photothyristor P turns on when one of or both of the n-gate layer 82 and the p-gate layer 83 absorb(s) light.

Since the photothyristor P includes the voltage reduction layer 90, the rising voltage is low. That is, the voltage to maintain the photothyristor P in the on-state is low. Thus, power consumption of the photothyristor P is reduced.

In addition, since the voltage reduction layer 90 has a small bandgap energy, the voltage reduction layer 90 also functions as a light-absorbing layer. Thus, the photothyristor P operates at a low input light intensity.

Such a photothyristor P is usable for optical computing, an optical computation process, and the like. In these cases, the use of the photothyristor P according to the fifth exemplary embodiment reduces the power consumption.

Further, if the voltage reduction layer 90 described in the first to fifth exemplary embodiments is provided in a thyristor used in a power electric circuit, the thyristor has reduced power consumption in the on-state. Since the structure of such a thyristor is similar to the structure of the transfer thyristor T illustrated in FIGS. 6A and 6B, a description thereof is omitted.

In the first to fourth exemplary embodiments, the conductivity types of the light-emitting elements (the light-emitting diodes LED, the laser diodes LD, and the vertical-cavity surface-emitting lasers VCSEL) and of the thyristors (the transfer thyristors T and the driving thyristors S) may be reversed, and the polarity of the circuit may be changed. That is, the anode-common circuit may be changed to a cathode-common circuit.

To reduce light emission delay and relaxation oscillation at the time of turn-on of the light-emitting elements (the light-emitting diodes LED, the laser diodes LD, and the vertical-cavity surface-emitting lasers VCSEL), a small current that is greater than or equal to a threshold current may be caused to flow through the light-emitting elements in advance to set the light-emitting elements in a light-emitting state or an oscillation-state. That is, the light-emitting elements may be caused to emit weak light or slightly oscillate before the respective driving thyristors S turn on, and the amount of light emitted by the light-emitting elements may be increased when the respective driving thyristors S turn on so that a predetermined amount of light is emitted. Examples of such a configuration may include the following. For example, an electrode is formed at the anode layer of each light-emitting element (the light-emitting diode LED, the laser diode LD, or the vertical-cavity surface-emitting laser VCSEL). A voltage or current source may be connected to this electrode, and a weak current may be supplied to the light-emitting element from this voltage or current source before the driving thyristor S turns on.

Further, the SLED array constituted by the light-emitting elements (the light-emitting diodes LED, the laser diodes LD, or the vertical-cavity surface-emitting lasers VCSEL) and the thyristors (the transfer thyristors T and the driving thyristors S) has been described above. The SLED array may include other members such as thyristors, diodes, or resistors for control in addition to the aforementioned components.

In addition, the transfer thyristors T are connected to each other by the respective coupling diodes D. However, the transfer thyristors T may be connected to each other by respective members capable of transferring a change in the potential, such as resistors.

In addition, the driving thyristors S according to the first to fourth exemplary embodiments may have a structure other than the pnpn four-layer structure as long as the structure implements functions of the driving thyristors S in the exemplary embodiments. For example, the driving thyristors S may have a pinin structure, a pipin structure, an npip structure, or a pnin structure having characteristics of the thyristors. Likewise, the transfer thyristors T may have a structure other than the pnpn four-layer structure as long as the structure implements functions of the transfer thyristors T in the exemplary embodiments. For example, the transfer thyristors T may have a pinin structure, a pipin structure, an npip structure, or a pnin structure having characteristics of the thyristors. In this case, one of the i-layer, the n-layer, and the i-layer sandwiched by the p-layer and the n-layer in the pinin structure or one of the n-layer and the i-layer sandwiched by the p-layer and the n-layer in the pnin structure may serve as a gate layer, and the p-ohmic electrode 332 disposed on the gate layer may serve as the gate Gt (gate Gs). Alternatively, one of the i-layer, the p-layer, and the i-layer sandwiched by the n-layer and the p-layer in the npip structure or one of the p-layer and the i-layer sandwiched by the n-layer and the p-layer in the npip structure may serve as the gate layer and the p-ohmic electrode 332 disposed on the gate layer may serve as the terminal of the gate Gt (gate Gs).

Further, the voltage reduction layer 90 may be inserted as part of one of the layers. The voltage reduction layer 90 may contain an impurity similar to that of the inserted layer, may have the same conductivity type as that of the inserted layer or may be of i-type.

The same applies to the photothyristor S described in the fifth exemplary embodiment.

In the first to fourth exemplary embodiments, the conductivity types of the light-emitting elements (the light-emitting diodes LED, the laser diodes LD, and the vertical-cavity surface-emitting lasers VCSEL) and of the thyristors (the transfer thyristors T and the driving thyristors S) may be reversed, and the polarity of the circuit may be changed. That is, the anode-common circuit may be changed to a cathode-common circuit. In addition, the relationship in which the light-emitting element and the thyristor are stacked may be reversed. Specifically, a layered structure in which the light-emitting element is stacked on the substrate and the thyristor is stacked on the light-emitting layer may be used. That is, the light-emitting element and the thyristor just need to be stacked in a stacking direction. In this case, if a light-emitting element that emits light from its end face is used as the light-emitting element disposed on the substrate, the light emitted from the light-emitting element exits to outside without through the thyristor.

A semiconductor structure in which plural semiconductor layers including the voltage reduction layer 90 that constitute the thyristor and plural semiconductor layers that constitute the light-emitting element are stacked with a semiconductor layer constituting the tunnel junction layer 85 or the metallic conductive III-V compound layer interposed therebetween is usable for applications other than the SLED array. For example, the semiconductor structure may be used as a single light-emitting element or a light-emitting element array other than the SLED array that turns on in response to input of an electric signal or optical signal from the outside.

In each of the exemplary embodiments, the cases where the light-emitting chips are used in a printhead and in an image forming apparatus that uses the printhead have been described. However, the light-emitting chips may be used in a light-emitting device other than these devices. For example, the light-emitting chips may be used in a light-emitting device for a projector or a three-dimensional printer or in a light-emitting device used for object shape recognition or distance measurement. In the cases where the light-emitting chips are used for these applications, a line of light emitted from the light-emitting chips may be reflected in a direction crossing this line. That is, light emitted from the light-emitting chips arranged in a line in the main scanning direction may be reflected in a sub-scanning direction crossing the line, so that the light is emitted two dimensionally. A polygon mirror, a micro electro mechanical systems (MEMS) mirror, or the like may be used as a reflector. In addition, in the case where light is emitted from the light-emitting chips two dimensionally, the light may be emitted only through an optical system, such as a lens, without using the reflector.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A layered structure comprising:
a thyristor that at least includes four layers, the four layers being an anode layer, a first gate layer, a second gate layer, and a cathode layer arranged in this order; and
a light-emitting element that is disposed such that the light-emitting element and the thyristor are connected in series,
wherein the thyristor includes a semiconductor layer having a bandgap energy smaller than bandgap energies of the four layers,
the light emitting element has a p-type anode layer, a light-emitting layer, and an n-type cathode layer, and
the light-emitting element is a light-emitting diode or a laser element.

2. The layered structure according to claim 1, wherein the light-emitting element includes a light-emitting layer, and
the semiconductor layer is a semiconductor layer having a bandgap energy smaller than a bandgap energy of the light-emitting layer.

3. A layered structure comprising:
a thyristor that at least includes four layers, the four layers being an anode layer, a first gate layer, a second gate layer, and a cathode layer arranged in this order; and
a light-emitting element that is disposed such that the light-emitting element and the thyristor are connected in series,
wherein the thyristor includes a semiconductor layer having a bandgap energy smaller than bandgap energies of the four layers, and
the semiconductor layer is disposed between the anode layer and the first gate layer.

4. The layered structure according to claim 2, wherein the semiconductor layer is disposed between the anode layer and the first gate layer.

5. The layered structure according to claim 3, wherein a gate electrode is disposed on the first gate layer.

6. The layered structure according to claim 4, wherein a gate electrode is disposed on the first gate layer.

7. The layered structure according to claim 1, wherein the semiconductor layer is disposed between the second gate layer and the cathode layer.

8. A layered structure comprising:
a thyristor that at least includes four layers, the four layers being an anode layer, a first gate layer, a second gate layer, and a cathode layer arranged in this order; and
a light-emitting element that is disposed such that the light-emitting element and the thyristor are connected in series,
wherein the thyristor includes a semiconductor layer having a bandgap energy smaller than bandgap energies of the four layers,
the light-emitting element includes a light-emitting layer,
the semiconductor layer is a semiconductor layer having a bandgap energy smaller than a bandgap energy of the light-emitting layer, and
the semiconductor layer is disposed between the second gate layer and the cathode layer.

9. The layered structure according to claim 7, wherein a gate electrode is disposed on the second gate layer.

10. The layered structure according to claim 8, wherein a gate electrode is disposed on the second gate layer.

11. A light-emitting component comprising:
a plurality of transfer elements that sequentially enter an on-state; and
a plurality of layered structures each connected to a corresponding one of the plurality of transfer elements, each of the plurality of layered structures being the layered structure according to claim 1,
wherein when the plurality of transfer elements sequentially enters the on-state, the thyristors of the plurality of layered structures sequentially become ready to enter the on-state, and when the thyristors of the plurality of layered structures sequentially enter the on-state, the corresponding light-emitting elements of the plurality of layered structures sequentially emit light or increase an amount of emitted light.

12. A light-emitting device comprising:
the light-emitting component according to claim 11; and
an optical system that emits light emitted from the light-emitting component two-dimensionally.

13. An image forming apparatus comprising:
an image bearing member;
a charging member that charges the image bearing member;
an exposure device including the light-emitting component according to claim 11, the exposure device being configured to expose the image bearing member to light through an optical system;

a developing member that develops an electrostatic latent image formed on the image bearing member that has been exposed to light by the exposure device; and a transfer member that transfers an image developed on the image bearing member onto a transferred-image-receiving medium.

14. The layered structure according to claim 1, wherein the light-emitting element is the laser element.

15. The layered structure according to claim 14, wherein the laser element is a VCSEL element.

16. The layered structure according to claim 1, wherein the light-emitting element is the light-emitting diode.

17. The layered structure according to claim 1, wherein the first gate layer is in contact with the second gate layer.

* * * * *